(12) United States Patent
Um et al.

(10) Patent No.: US 12,704,984 B2
(45) Date of Patent: Aug. 11, 2026

(54) MEMORY DEVICE, METHOD OF CALIBRATING SIGNAL LEVEL THEREOF, AND MEMORY SYSTEM HAVING THE SAME

(71) Applicant: Samsung Electronics Co., Ltd., Suwon-si (KR)

(72) Inventors: Youngdo Um, Suwon-si (KR); Jaewoo Park, Suwon-si (KR); Younghoon Son, Suwon-si (KR); Youngdon Choi, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 18/243,350

(22) Filed: Sep. 7, 2023

(65) Prior Publication Data

US 2023/0418488 A1 Dec. 28, 2023

Related U.S. Application Data

(63) Continuation of application No. 17/239,592, filed on Apr. 24, 2021, now Pat. No. 11,782,618.

(30) Foreign Application Priority Data

Sep. 14, 2020 (KR) ........................ 10-2020-0117509

(51) Int. Cl.
*G11C 7/10* (2006.01)
*G06F 3/06* (2006.01)
(Continued)

(52) U.S. Cl.
CPC .......... *G06F 3/0632* (2013.01); *G06F 3/0604* (2013.01); *G06F 3/0659* (2013.01);
(Continued)

(58) Field of Classification Search
None
See application file for complete search history.

(56) References Cited

U.S. PATENT DOCUMENTS 8,384,423 B2 2/2013 Nguyen et al.
9,559,880 B1 1/2017 Cirit et al.
(Continued)

FOREIGN PATENT DOCUMENTS

WO 2019032270 A1 2/2019
WO WO-2020073300 A1 * 4/2020 ....... G11C 29/50008

OTHER PUBLICATIONS

Office Action dated Dec. 17, 2024 for corresponding application No. KR 10-2020-0117509.
(Continued)

*Primary Examiner* — Anh Q Tran
(74) *Attorney, Agent, or Firm* — Muir Patent Law, PLLC

(57) ABSTRACT

A method of calibrating a signal level of a memory device includes performing pull-up code and pull-down code calibrations, using a ZQ calibration for non-return-to-zero (NRZ) signaling, performing a most significant bit (MSB) code calibration, using an MSB additional driver for pulse amplitude modulation level-4 (PAM4) signaling, and performing a least significant bit (LSB) code calibration using an LSB additional driver for the PAM4 signaling.

17 Claims, 21 Drawing Sheets

(51) Int. Cl.
*H04L 25/49* (2006.01)
*H03M 5/02* (2006.01)

(52) U.S. Cl.
CPC .............. *G06F 3/0673* (2013.01); *G11C 7/10* (2013.01); *G11C 7/1051* (2013.01); *G11C 7/1057* (2013.01); *G11C 7/1084* (2013.01); *H04L 25/4917* (2013.01); *G11C 2207/2254* (2013.01); *H03M 5/02* (2013.01)

(56) References Cited

U.S. PATENT DOCUMENTS

| | | | | |
|---|---|---|---|---|
| 9,998,305 | B2 | 6/2018 | Zerbe et al. | |
| 10,128,842 | B1 * | 11/2018 | Lin | H03K 19/0005 |
| 10,312,896 | B2 | 6/2019 | Kim et al. | |
| 10,469,070 | B1 | 11/2019 | Liu et al. | |
| 2011/0025373 | A1 | 2/2011 | Kim et al. | |
| 2012/0099383 | A1 | 4/2012 | Kim et al. | |
| 2015/0074437 | A1 | 3/2015 | Ware et al. | |
| 2017/0099050 | A1 | 4/2017 | Lee et al. | |
| 2017/0331476 | A1 | 11/2017 | Cho et al. | |
| 2019/0044769 | A1 * | 2/2019 | Hollis | G11C 29/022 |
| 2019/0096450 | A1 | 3/2019 | Jung | |
| 2019/0296740 | A1 | 9/2019 | Lin | |
| 2019/0312759 | A1 | 10/2019 | Chen et al. | |
| 2019/0394071 | A1 * | 12/2019 | Farzan | H03H 7/38 |
| 2020/0382121 | A1 * | 12/2020 | Jeong | H03K 19/0005 |

OTHER PUBLICATIONS

P. Upadhyaya et al., “A Fully Adaptive 19-58-GB/s PAM-4 and 9.5-29-GB/s NRZ Wireline Transceiver With Configurable ADC in 16-nm FinFET”, IEEE J. Solid-State Circuits. 2018, pp. 18-28 (Nov. 18, 2018).

Changho Hyun et al., “A 20Gb/s Dual-Mode PAM4/NRZ Single-Ended Transmitter with RLM Compensation”, 2019 IEEE, Seoul, South Korea.

* cited by examiner (a)

VDD $\frac{3}{6}$VDD V1(11)

$\frac{2}{6}$VDD V2(10)

$\frac{1}{6}$VDD V3(01)

MEMORY DEVICE, METHOD OF CALIBRATING SIGNAL LEVEL THEREOF, AND MEMORY SYSTEM HAVING THE SAME

CROSS-REFERENCE TO RELATED APPLICATION(S)

This application is a Continuation of U.S. patent application Ser. No. 17/239,592 filed on Apr. 24, 2021, now Allowed, which claims the benefit under 35 USC 119(a) of Korean Patent Application No. 10-2020-0117509 filed on Sep. 14, 2020 in the Korean Intellectual Property Office, the disclosure of each of which is incorporated herein by reference in its entirety.

BACKGROUND

The present disclosure of inventive concept relates to a memory device, a method of calibrating a signal level thereof, and a memory system having the same.

In general, demand for high-capacity and high-speed data transmissions is increasing, with the rapid supply of mobile devices and a rapid increase in the amount of internet access. However, a signal modulation scheme based on non-return-to-zero (NRZ)-type encoding may be difficult to use to satisfy such high capacity and high speed data transmission requirements. Recently, a pulse amplitude modulation 4-level (PAM4) method has been actively studied as an alternative to the signal method for high-capacity and high-speed data transmissions.

SUMMARY

Example embodiments provide a memory device controlling a ratio of level separation mismatch (RLM), a method of calibrating a signal level thereof, and a memory system including the same.

Example embodiments provide a memory device maintaining an identical signal level interval of multilevel signaling, a method of calibrating a signal level thereof, and a memory system including the same.

According to example embodiments, a memory device comprise a transceiver configured to transmitor receive data according to multilevel signaling; and a ratio of level separation mismatch (RLM) controller configured to adjust at least one gap between signal levels during a data transmission operation of the transceiver, wherein the RLM controller includes: a resistor connected between a first node and a ground terminal, a first comparator configured to output a first comparison voltage by comparing a first adjusted voltage of the first node to a first reference voltage, a second comparator configured to output a second comparison voltage by comparing a second adjusted voltage of a second node to a second reference voltage; a first code generator configured to generate a pull-up code, a most significant bit (MSB) additional code, or a least significant bit (LSB) additional code, corresponding to the first comparison voltage; a second code generator configured to generate a pull-down code corresponding to the second comparison voltage; a first MSB pull-up driver connected between a power supply terminal and the first node and configured to control driving capability for at least a first higher bit according to the pull-up code, a first LSB pull-up driver connected between the power supply terminal and the first node and configured to control driving capability for at least a first lower bit according to the pull-up code, a first MSB pull-down driver connected between the first node and the ground terminal and configured to control driving capability for at least a first higher bit according to the pull-down code, and a first LSB pull-down driver connected between the first node and the ground terminal and configured to control driving capability for at least a first lower bit according to the pull-down code; a second MSB pull-up driver connected between the power supply terminal and the second node and configured to control driving capability for at least a second higher bit according to the pull-up code; a second LSB pull-up driver connected between the power supply terminal and the second node and configured to control driving capability for at least a second lower bit according to the pull-up code; a second MSB pull-down driver connected between the second node and the ground terminal and configured to control driving capability for at least a second higher bit according to the pull-down code; a second LSB pull-down driver connected between the second node and the ground terminal and configure to control driving capability for at least a second lower bit according to the pull-down code; and an MSB additional driver connected to the first node and configured to control driving capability for at least a first higher bit according to the MSB additional code; and an LSB additional driver connected to the first node and configured to control driving capability for at least a first lower bit according to the LSB additional code.

According to example embodiments, a method of calibrating a signal level of a memory device includes performing pull-up code and pull-down code calibrations, using a ZQ calibration for a first signaling; performing an additional most significant bit (MSB) code calibration, using an MSB additional driver connected to a first node for a second signaling; and performing an additional least significant bit (LSB) code calibration using ana LSB additional driver for the second signaling. The first signaling may be 2-level signal and the second signaling may be at least 3-level signal.

According to example embodiments, a memory system comprises, a memory device; and a controller configured to control the memory device, wherein the memory device includes, a first transceiver configured to receive or transmit data in a manner selected from a first signaling or a second signaling through a data channel; and a first ratio of level separation mismatch (RLM) controller configured to maintain at least one gap between signal levels of the second signaling to be identical to each other when transferring data from the first transceiver to the controller.

According to example embodiments, a controller comprises: a clock generator configured to provide a clock to a memory device; a command address generator configured to generate a command address signal to operate the memory device; a command address transmitter configured to transmit the command address signal in response to the clock; a transceiver configured to transmit or receive data to or from the memory device in a manner selected from a first signaling and a second signaling through a data channel; and a training logic configured to transmit a ratio of level separation mismatch (RLM) calibration request for the second signaling to the memory device. The first signaling may be 2-level signal and the second signaling may be at least 3-level signal.

According to example embodiments, a memory device may include a resistor connected between a first node and a ground terminal, a first comparator configured to output a first comparison voltage by comparing a first adjusted voltage of the first node to a corresponding signal level among a plurality of signal levels in response to an activation signal, a second comparator configured to output a second comparison voltage by comparing a second adjusted voltage of a second node to a first signal level among the plurality of signal levels, a first code generator configured to generate a pull-up code and a most significant bit (MSB) additional code or a least significant bit (LSB) additional code corresponding to the first comparison voltage, a second code generator configured to generate a pull-down code corresponding to the second comparison voltage, a first MSB pull-up driver connected between a power supply terminal and the first node and configured to control driving capability for at least a first higher bit according to the pull-up code, a first LSB pull-up driver connected between the power supply terminal and the first node and configured to control driving capability for at least a first lower bit according to the pull-up code, a first MSB pull-down driver connected between the first node and a ground terminal and configured to control driving capability for the at least a first higher bit according to the pull-down code, a first LSB pull-down driver connected between the first node and the ground terminal and configured to control driving capability for the at least a first lower bit according to the pull-down code, a second MSB pull-up driver connected between the power supply terminal and the second node and configured to control driving capability for at least a second higher bit according to the pull-up code, a second LSB pull-up driver connected between the power supply terminal and the second node and configured to control driving capability for at least a second lower bit according to the pull-up code, a second MSB pull-down driver connected between the second node and the ground terminal and configured to control driving capability for the at least a second higher bit according to the pull-down code, a second LSB pull-down driver connected between the second node and the ground terminal and configured to control driving capability for the at least a second lower bit according to the pull-down code, an MSB additional driver connected to the first node and configured to control driving capability for the at least a first higher bit according to the MSB additional code, and an LSB additional driver connected to the first node and configured to control driving capability for the at least a first lower bit according to the LSB additional code.

According to example embodiments, a communication system comprises a first communication device including a first transceiver and a first ratio of level separation mismatch (RLM) controller; and a second communication device including a second transceiver and a second RLM controller, wherein each of the first and second RLM controllers maintains at least two gaps between signal levels of multi-level signaling to be identical to each other, using a ZQ calibration and an additional code calibration when transmitting data according to multilevel signaling of a corresponding transceiver.

BRIEF DESCRIPTION OF DRAWINGS

The above and other aspects, features, and advantages of the present inventive concept will be more clearly understood from the following detailed description, taken in conjunction with the accompanying drawings, in which:

FIGS. 7A and 7B are diagrams illustrating a code generation process of an RLM controller according to example embodiments;

FIGS. 8A and 8B are diagrams illustrating an additional MSB calibration process of an RLM controller according to example embodiments;

FIGS. 9A and 9B are diagrams illustrating an additional LSB calibration process of an RLM controller according to example embodiments;

DETAILED DESCRIPTION

Hereinafter, the contents of the present inventive concept will be described clearly and in detail enough to be easily implemented by those of ordinary skill in the art using the drawings.

Figure 1:
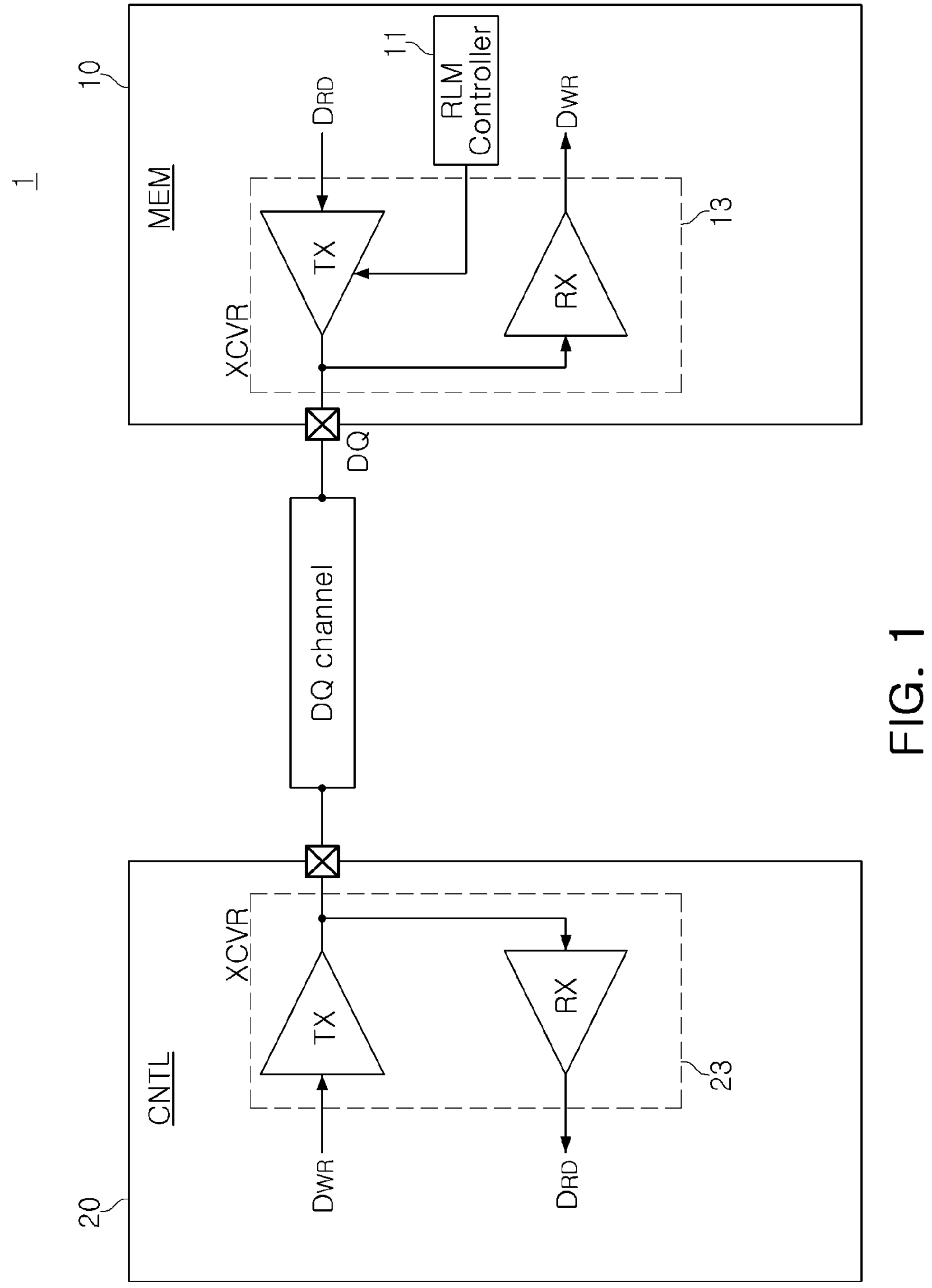
FIG. 1 is a diagram illustrating a memory system according to an example embodiment.

FIG. 1 is a diagram illustrating a memory system according to an example embodiment.

Referring to FIG. 1, a memory system 1 may include a memory device 10 and a controller 20. In this case, the memory system 1 may be implemented as a multi chip package (MCP) or a system on chip (SoC).

The memory device 10 may be implemented to store data received from the controller 20 or to output the read data to the controller 20. The memory device 10 may be used as an operation memory, a working memory, or a buffer memory in a computing system. In an example embodiment, the memory device 10 may be implemented as a single in-line memory module (SIMM), a dual in-line memory module (DIMM), a small-outline DIMM (SODIMM), an unbuffered DIMM (UDIMM), a fully-buffered DIMM (FBDIMM), a Rank-Buffered DIMM (RBDIMM), a mini-DIMM, a micro-DIMM, a Registered DIMM (RDIMM), or a Load-Reduced DIMM (LRDIMM).

In an example embodiment, the memory device 10 may be implemented as a volatile memory. For example, the volatile memory may include at least one of Dynamic Random Access Memory (DRAM), Synchronous DRAM (SDRAM), Double Data Rate SDRAM (DDR SDRAM), Low Power Double Data Rate SDRAM (LPDDR SDRAM), Graphics Double Data Rate SDRAM (GDDR SDRAM), Rambus DRAM (RDRAM), and Static RAM (SRAM). In example embodiments, the memory device 10 may be implemented as a nonvolatile memory. For example, the non-volatile memory may include at least one of NAND flash memory, Phase-change RAM (PRAM), Magneto-resistive RAM (MRAM), Resistive RAM (ReRAM), Ferro-electric RAM (FRAM), and NOR flash memory.

Although not illustrated, the memory device 10 may include a Serial Presence Detect (SPD) chip. The SPD chip may be implemented to store information on the characteristics of the memory device 10. In an example embodiment, the SPD chip may store memory device information such as a module type, an operating environment, a line arrangement, a module configuration, and a storage capacity of the memory device 10. In an example embodiment, the SPD chip may include a programmable read-only memory, for example, an Electrically Erasable Programmable Read Only Memory (EEPROM).

In addition, the memory device 10 may include a ratio of level mismatch (RLM) controller 11 and a transceiver (XCVR) 13. The RLM may be referred to as "level separation mismatch ratio," "ratio level mismatch," or "ratio of level separation mismatch."

The RLM controller 11 may be implemented to control a level mismatch according to multilevel signaling. For example, the RLM controller 11 may adjust/compensate/vary at least one gap between signal levels used for multilevel signaling, thus the RLM controller 11 may maintain the gaps between signal levels to be identical to each other. In the following, for convenience of description, multilevel signaling will be referred to as pulse amplitude modulation 4-level (PAM4) signaling. It should be understood that the multilevel signaling of the present inventive concept is not limited to PAM4 signaling.

In an example embodiment, the RLM controller 11 may apply a ratio of level mismatch (RLM) calibration for PAM4 signaling using a ZQ-calibration circuit and an additional driver. For example, the RLM controller 11 may have identical gaps for PAM4 signal levels. Further, the RLM controller 11 has a voltage source that freely sets the reference voltage, so that the RLM of PAM4 may be freely set. In addition, the RLM controller 11 may perform a calibration of an additional driver while changing the reference voltage after completion of the pull-up/pull-down code calibration.

The transceiver (XCVR) 13 may be implemented to transmit and receive data through a data channel (DQ channel) according to signaling. The transceiver 13 may include a transmitter (TX) and a receiver (RX).

The transmitter TX of the memory device 10 may be implemented to transmit read data $D_{RD}$ to the controller 20 through the data channel according to signaling. In detail, the transmitter TX of the transceiver 13 may perform compensation according to the RLM control of the RLM controller 11 and may transmit data according to PAM4 signaling. The receiver RX of the memory device 10 may be implemented to receive write data DWR from the controller 20 through the data channel according to signaling.

In an example embodiment, the transceiver 13 may be implemented as a dual-mode transceiver. In this case, the signaling may be one of non-return-to-zero (NRZ) signaling and PAM4 signaling. The NRZ signaling, also called pulse amplitude modulation 2-level, is a binary code using low and high signal levels to represent the 1/0 information of a digital logic signal. The NRZ signaling can only transmit 1 bit, i.e. a 0 or 1, of information per signal symbol period. The controller 20 may be implemented to control the memory device 10. The controller may know the signaling mode stored in the memory device 10. The controller 20 may transmit and receive data to and from the memory device 10 through the data channel according to a signaling mode.

The controller 20 may include a transceiver 23. The transceiver 23 may include a transmitter (TX) and a receiver (RX). The transmitter TX of the controller 20 may be implemented to transmit the write data DWR to the memory device 10 through the data channel according to a signaling mode PAM4/NRZ. The receiver RX of the controller 20 may be implemented to receive the read data $D_{RD}$ from the memory device 10 through the data channel according to signaling. In an example embodiment, the transceiver 23 may be implemented as a dual-mode transceiver.

In an example embodiment, the controller 20 may be configured as a separate chip or may be integrated with the memory device 10. For example, the controller 20 may be implemented on a motherboard. In addition, the controller 20 may be implemented as an integrated memory controller (IMC) included in a microprocessor. In addition, the controller 20 may be located in an input/output hub. In addition, the input/output hub including the controller 20 may be referred to as a memory controller hub (MCH).

In a general memory system, only the NRZ ZQ-calibration is used to find the strength of the driver. For example, gds distortion may occur according to the level of the strength PAM4 based on a half power supply voltage (VDD)/2. Accordingly, the strength of the driver may vary. As a result, the gaps between the PAM4 signal levels may not be identical to each other. If the gaps for levels are not identical, the signal sensing margin of the receiver RX may decrease.

In the case of the memory system 1 according to the example embodiment of the present inventive concept, signal gaps of multilevel signaling may be identical to each other by compensating for gds distortion at the remaining levels of multilevel signaling in the RLM controller 11.

Figure 2A:
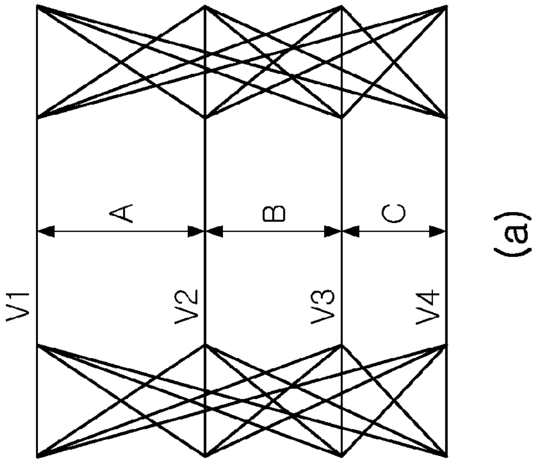
FIG. 2A is a drawing illustrating RLM control according to an example embodiment.
Figure 2A:
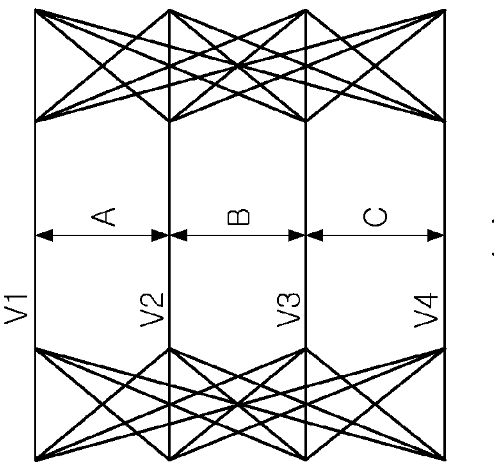
Figure 2A:
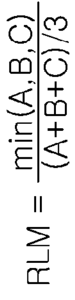

FIG. 2A is a drawing illustrating RLM control according to an example embodiment. In FIG. 2A, for convenience of description, multilevel signaling will be referred to as PAM4. Referring to FIG. 2A, the mismatch ratio RLM of the signal level may be expressed by the following equation.

$$RLM = \frac{\min(A, B, C)}{(A + B + C)/3} \quad \text{Equation 1}$$

In the above equation 1, each of A, B and C is a gap (V1-V2, V2-V3, and V3-V4) between signal levels (V1 to V4), and min is a function for selecting a minimum value. FIG. 2A (a) illustrates a state in which level compensation is not performed, and FIG. 2A (b) illustrates a state in which level compensation is performed.

As illustrated in FIG. 2A (a), when a level compensation is not performed, at least one of gaps A, B and C may be different from one another. In contrast, as illustrated in FIG. 2A (b), when the level compensation is performed, the gaps A, B and C may be identical to each other.

Figure 2B:
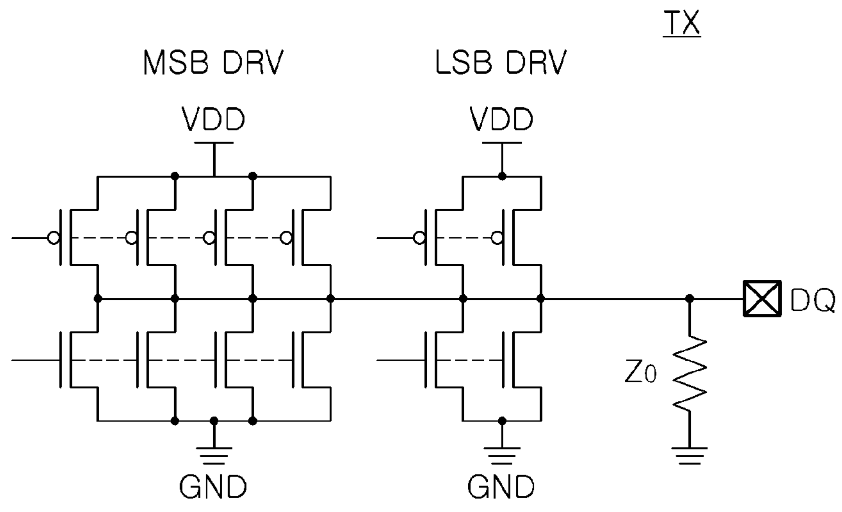
FIG. 2B is a circuit diagram illustrating a transmitter (TX) according to an example embodiment.

FIG. 2B is a circuit diagram illustrating a transmitter TX according to an example embodiment. Referring to FIG. 2B, the transmitter TX may include an MSB driver (pull-up/ pull-down driver) MSB DRV and an LSB driver (pull-up/pull-down driver) LSB DRV connected to a DQ pad. Herein, voltage levels of the DQ pad may have at least two signal levels from among the four signal levels V1 to V4. The transmitter TX may transmit data representing a first signaling which is a data signal having signal levels V1 and V4. In this case, the memory device may only perform a ZQ calibration by a ZQ calibration circuit. In an example embodiment, the transmitter TX may transmit data representing a second signaling which is a data signal having signal levels V1 and V4 and one or more additional signal levels V2 and V3. In this case, the memory device 10 may perform the ZQ calibration and a RLM calibration by the ZQ calibration circuit and the RLM controller 11. The MSB driver may include a plurality of P-channel Metal-Oxide-Semiconductor (PMOS) transistors connected between a power supply terminal or a power supply voltage (VDD) and the DQ pad in parallel, and a plurality of N-channel Metal-Oxide-Semiconductor (NMOS) transistors connected between the DQ pad and a ground terminal or a ground voltage (GND) in parallel. The LSB driver may include a plurality of PMOS transistors connected between the power supply terminal VDD and the DQ pad in parallel, and a plurality of NMOS transistors connected between the DQ pad and the ground terminal GND in parallel. An external resistor $Z_0$ may be connected between the DQ pad and the ground terminal GND. For example, the transmitter TX may need a termination impedance having a specific impedance value in the DQ pad. For example, a resistance of the external resistor $Z_0$ may be the termination impedance in the DQ pad. The impedance of the external resistor $Z_0$ may correspond to a characteristic impedance in the receiver RX of the controller 20.

Figure 2C:
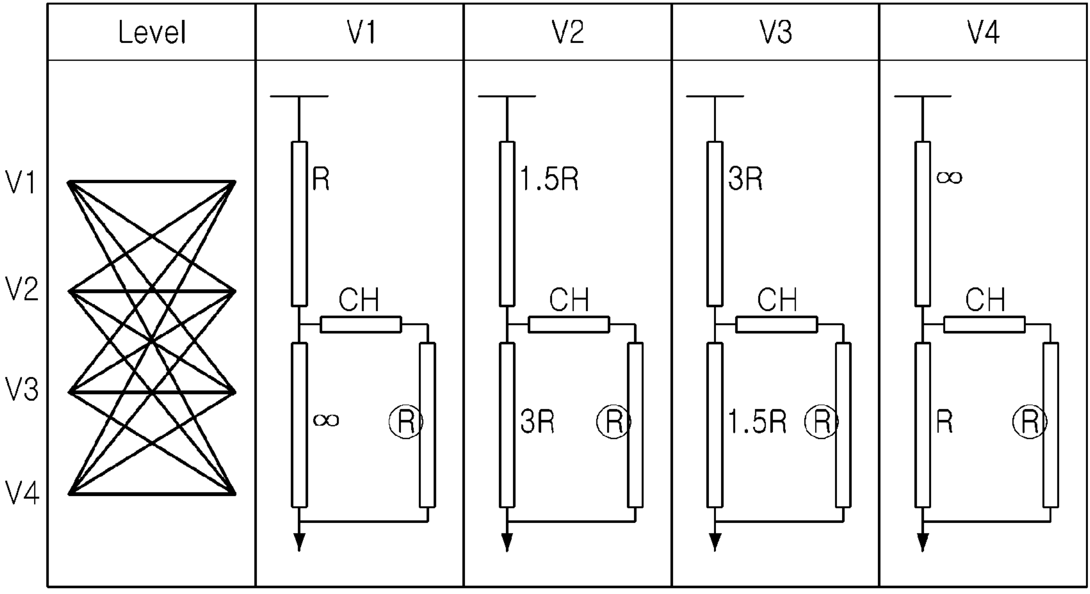
FIG. 2C is a diagram illustrating an example of resistance corresponding to a symbol according to an example embodiment.

FIG. 2C is a diagram illustrating signal levels V1 to V4 according to pull-up/pull-down drive resistances of the transmitter TX according to an example embodiment. As illustrated in FIG. 2C, the output terminal OUT may be connected to a termination resistor Ⓡ through a channel CH. For example, when the pull-up resistance is R and the pull-down resistance is infinite, the first signal level V1 may correspond thereto, and when the pull-up resistance is 1.5R and the pull-down resistance is 3R, the second signal level V2 may correspond thereto, and when the pull-up resistance is 3R and the pull-down resistance is 1.5R, a third signal level V3 may correspond thereto, and when the pull-up resistance is infinite and the pull-down resistance is R, the fourth signal level V4 may correspond thereto. In this case, R is a resistance value corresponding to the characteristic impedance $Z_0$. In an example embodiment, R may be the same according to the channel. In example embodiments, R may be different depending on the channel. For example, it should be understood that the relationship between the signal level and the resistance is not limited to FIG. 2C. The channel having a resistance value R may be connected to the DQ pad and a termination resistor (11) having the same resistance value R.

In the following, for convenience of description, multi-level signaling will be referred to as PAM4 signaling.

Figure 3:
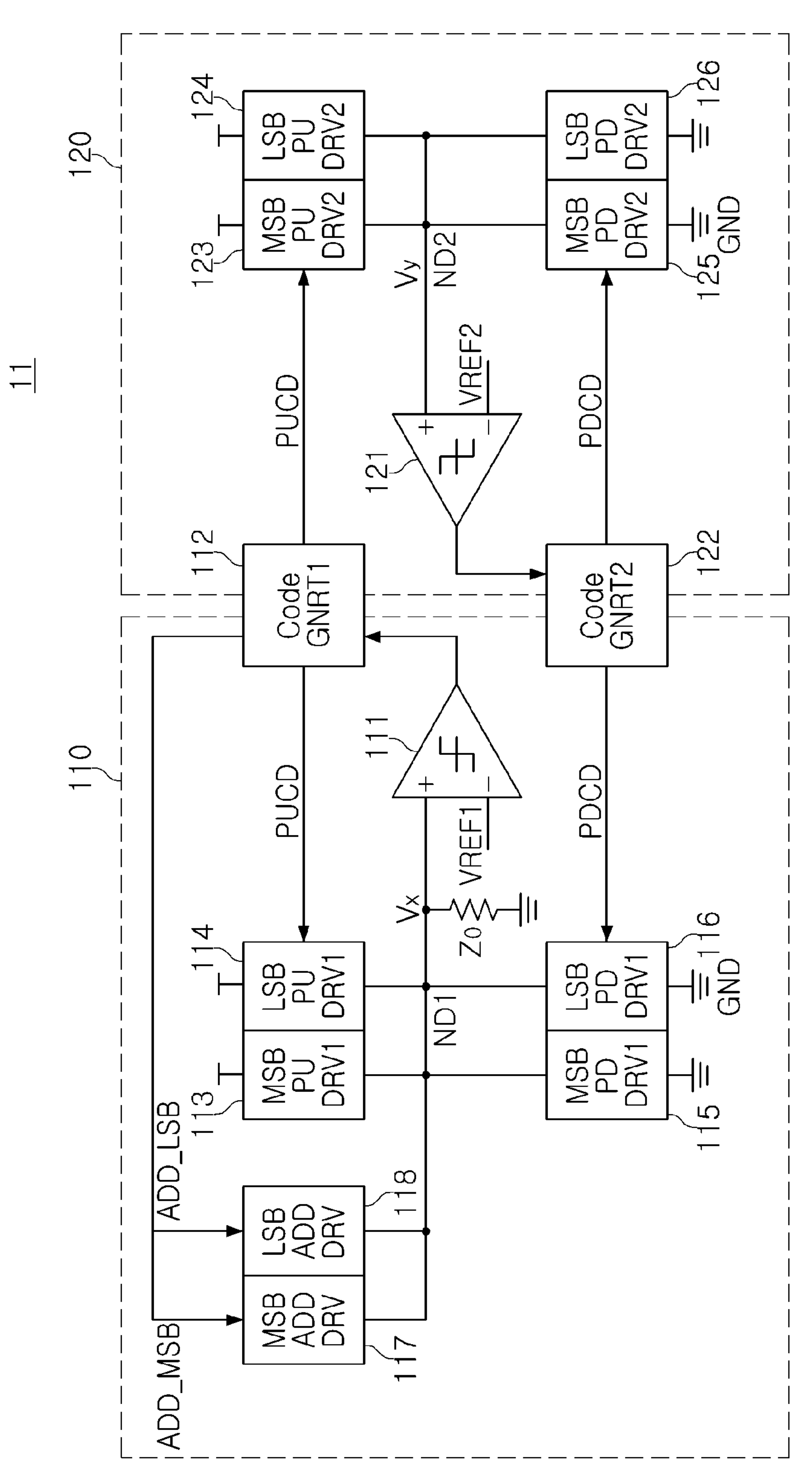
FIG. 3 is a diagram illustrating an RLM controller 11 according to an example embodiment.

FIG. 3 is a diagram illustrating an RLM controller 11 according to an example embodiment. Referring to FIG. 3, the RLM controller 11 may include a first comparator 111, a second comparator 121, a first code generator 112, a second code generator 122, a first most significant bit (MSB) pull-up driver (MSB PU DRV1) 113, a second MSB pull-up driver (MSB PU DRV2) 123, a first least significant bit (LSB) pull-up driver (LSB PU DRV1) 114, a second LSB pull-up driver (LSB PU DRV2) 124, a first MSB pull-down driver (MSB PD DRV1) 115, a second MSB pull-down driver (MSB PD DRV2) 125, a first LSB pull-down driver (LSB PD DRV1) 116, a second LSB pull-down driver (LSB PD DRV2) 126, an MSB additional driver (MSB ADD DRV) 117, and an LSB additional driver (LSB ADD DRV) 118. In an example embodiment, a structure of the first MSB pull-up driver 113, the first LSB pull-up driver 114, the first MSB pull-down driver 115, and the first LSB pull-down driver 116 may be the same as a structure of the second MSB pull-up driver 123, the second LSB pull-up driver 124, the second MSB pull-down driver 125, and the second LSB pull-down driver 126.

The first comparator 111 may be implemented to output a first comparison voltage by comparing a first adjusted voltage Vx of a first node ND1 to a first reference voltage VREF1. In this case, the first adjusted voltage Vx is a voltage corresponding to the characteristic impedance $Z_0$.

The second comparator 121 may be implemented to output a second comparison voltage by comparing a second adjusted voltage Vy of a second node ND2 to a second reference voltage VREF2.

The first code generator 112 may be implemented to receive the first comparison voltage of the first comparator 111 and generate a corresponding pull-up code PUCD. In example embodiments, the first code generator 112 may further generate a first additional code or an MSB additional code (ADD_MSB) and/or a second additional code or an LSB additional code (ADD_LSB). In an example embodiment, the pull-up code PUCD may include m-bit (where m is an integer greater than or equal to 2) data. In an example embodiment, each of the MSB and LSB additional codes ADD_MSB and ADD_LSB may include k-bit (where k is an integer of 2 or more) data.

The second code generator 122 may be implemented to receive the second comparison voltage of the second comparator 121 and to generate a corresponding pull-down code PDCD. In an example embodiment, the pull-down code PDCD may include n-bit (where n is an integer greater than or equal to 2) data.

The first MSB pull-up driver (MSB PU DRV1) 113 may be implemented to receive the pull-up code PUCD and adjust the pull-up driver strength (or driving capability) for the MSB in response to the pull-up code PUCD. In an example embodiment, the first MSB pull-up driver 113 may include a plurality of transistors connected between the power supply terminal VDD and the first node ND1 in parallel and turned on/off in response to the pull-up code PUCD. In an example embodiment, each of the plurality of transistors of the first MSB pull-up driver 113 may be implemented as a P-channel Metal Oxide Semiconductor (PMOS) transistor or an N-channel Metal Oxide Semiconductor (NMOS) transistor.

The second MSB pull-up driver (MSB PU DRV2) 123 may be implemented to receive the pull-up code PUCD and adjust the pull-up driver strength for the MSB in response to the pull-up code PUCD. In an example embodiment, the second MSB pull-up driver 123 may include a plurality of transistors connected between the power supply terminal VDD and the second node ND2 in parallel and turned on/off in response to the pull-up code PUCD. In an example embodiment, each of the plurality of transistors of the second MSB pull-up driver 123 may be implemented as a PMOS transistor or an NMOS transistor.

The first LSB pull-up driver (LSB PU DRV1) 114 may be implemented to receive the pull-up code PUCD and adjust the pull-up driver strength for the LSB in response to the pull-up code PUCD. In an example embodiment, the first LSB pull-up driver 114 may include a plurality of transistors connected between the power supply terminal VDD and the first node ND1 in parallel and turned on/off in response to the pull-up code PUCD. In an example embodiment, each of the plurality of transistors of the first LSB pull-up driver 114 may be implemented as a PMOS transistor or an NMOS transistor.

The second LSB pull-up driver (LSB PU DRV2) 124 may be implemented to receive the pull-up code PUCD and adjust a pull-up driver strength for the LSB in response to the pull-up code PUCD. In an example embodiment, the second LSB pull-up driver 124 may include a plurality of transistors connected between the power supply terminal VDD and the second node ND2 in parallel and turned on/off in response to a pull-up code PUCD. In an example embodiment, each of the plurality of transistors of the second LSB pull-up driver 124 may be implemented as a PMOS transistor or an NMOS transistor.

The first MSB pull-down driver (MSB PD DRV1) 115 may be implemented to receive the pull-down code PDCD and adjust the pull-down driver strength for the MSB in response to the pull-down code PDCD. In an example embodiment, the first MSB pull-down driver 115 may include a plurality of transistors connected between the first node ND1 and the ground terminal GND in parallel and turned on/off in response to the pull-down code PDCD. In an example embodiment, each of the plurality of transistors of the first MSB pull-down driver 115 may be implemented as an NMOS transistor.

The second MSB pull-down driver (MSB PD DRV2) 125 may be implemented to receive the pull-down code PDCD and adjust the pull-down driver strength for the MSB in response to the pull-down code PDCD. In an example embodiment, the second MSB pull-down driver 125 may be connected between the second node ND2 and the ground terminal GND in parallel, and may include a plurality of transistors that are turned on/off in response to the pull-down code PDCD. In an example embodiment, each of the plurality of transistors of second MSB pull-down driver 125 may be implemented as an NMOS transistor.

The first LSB pull-down driver (LSB PD DRV1) 116 may be implemented to receive the pull-down code PDCD and adjust the pull-down driver strength for the LSB in response to the pull-down code PDCD. In an example embodiment, the first LSB pull-down driver 116 may be connected between the first node ND1 and the ground terminal GND in parallel, and may include a plurality of transistors that are turned on/off in response to the pull-down code PDCD. In an example embodiment, each of the plurality of transistors of the first LSB pull-down driver 116 may be implemented as an NMOS transistor.

The second LSB pull-down driver (LSB PD DRV2) 126 may be implemented to receive the pull-down code PDCD and adjust the pull-down driver strength for the LSB in response to the pull-down code PDCD. In an example embodiment, the second LSB pull-down driver 126 may be connected between the second node ND2 and the ground terminal GND in parallel, and may include a plurality of transistors that are turned on/off in response to the pull-down code PDCD. In an example embodiment, each of the plurality of transistors of the second LSB pull-down driver 126 may be implemented as an NMOS transistor.

The MSB additional driver (MSB ADD DRV) 117 may be implemented to receive the first additional code ADD_MSB and to adjust the strength of the additional driver for the MSB in response to the first additional code ADD_MSB. In an example embodiment, the MSB additional driver 117 includes a plurality of transistors connected between the power supply terminal VDD and the first node ND1 in parallel and turned on/off in response to the first additional code ADD_MSB. In an example embodiment, each of the plurality of transistors of the MSB additional driver 117 may be implemented as a PMOS transistor or an NMOS transistor.

The LSB additional driver (LSB ADD DRV) 118 may be implemented to receive the second additional code ADD_LSB and adjust the strength of the additional driver for the LSB in response to the second additional code ADD_LSB. In an example embodiment, the LSB additional driver 118 may include a plurality of transistors connected between the power supply terminal VDD and the first node ND1 in parallel and turned on/off in response to the second additional code ADD_LSB. In an example embodiment, each of the plurality of transistors of the LSB additional driver 118 may be implemented as a PMOS transistor or an NMOS transistor.

The MSB additional driver 117 and the LSB additional driver 118 illustrated in FIG. 3 are implemented as the pull-up driver, but it will be understood that the present inventive concept is not limited thereto. In example embodiments, the MSB additional driver 117 and the LSB additional driver 118 may also be implemented as the pull-down driver. In this case, a plurality of transistors of the MSB additional driver 117 and the LSB additional driver 118 may be connected between the first node ND1 and the ground terminal GND, and the second code generator 122 may further generate a first additional code ADD_MSB and/or a second additional code ADD_LSB.

For the convenience of description of RLM control below, the first comparator 111, the first code generator 112, the second code generator 122, the first MSB pull-up driver 113, the first LSB pull-up driver 114, the first MSB pull-down driver 115, the first LSB pull-down driver 116, the MSB additional driver 117, and the LSB additional driver 118 will be collectively referred to as a first part circuit 110. In addition, the second comparator 121, the first code generator 112, the second code generator 122, the second MSB pull-up driver 123, the second LSB pull-up driver 124, the first MSB pull-down driver 125, and the first LSB pull-down driver 126 will be collectively referred to as a second part circuit 120.

In example embodiments, the transmitter TX of the transceiver 13 in FIG. 1 may include the same structure as the first MSB pull-up driver 113, the first LSB pull-up driver 114, the first MSB pull-down driver 115, the first LSB pull-down driver 116, the MSB additional driver 117, and the LSB additional driver 118. The pull-up/pull-down codes PUCD/PDCD and the MSB/LSB additional codes ADD_MSB/ADD_LSB may be provided to the transmitter TX of the transceiver 13.

Figure 4A:
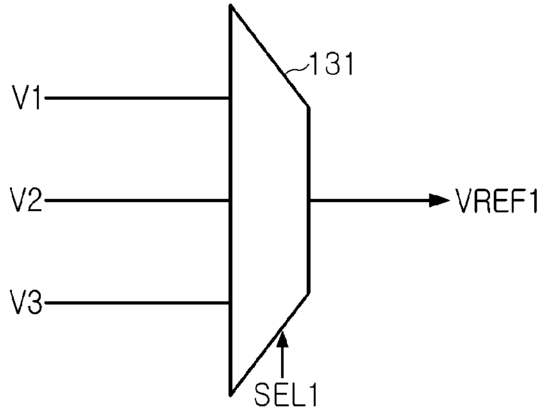
FIGS. 4A and 4B are diagrams illustrating reference voltage selectors according to example embodiments.
Figure 4B:
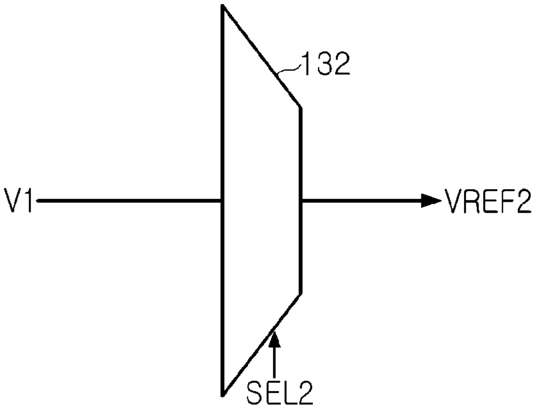

FIGS. 4A and 4B are diagrams illustrating reference voltage selectors according to example embodiments. Referring to FIG. 4A, a first selector 131 may be implemented to output one of a first signal level (V1, see FIG. 2A (b)), a second signal level (V2, see FIG. 2A (b)), and a third signal level (V3, see FIG. 2A (b)) as a first reference voltage VREF1. The first selector 131 may select one of the first through third signal levels V1, V2, and V3 as the first reference voltage VREF1 in response to a first selection signal SELL The first selection signal SEL1 may be provided from the controller 20 or the memory device 10. Referring to FIG. 4B, a second selector 132 may be implemented to output the first signal level V1 (see FIG. 2A (b)) as a second reference voltage VREF2. The second selector 132 may output the first signal level V1 as the second reference voltage VREF2 in response to a second selection signal SEL2. The second selection signal SEL2 may be provided from the controller 20 or the memory device 10.

The RLM controller 11 may generate the first adjusted voltage Vx as the first signal level (V1), the second signal level (V2), and the third signal level (V3) input to the first selector 131 and the second selector 132, and thus, RLM may be maintained the gaps between signal levels to be identical to each other.

Also, the RLM controller 11 may set the first signal level V1, the second signal level V2, the third signal level V3, and the fourth signal level V4 to be a predetermined level. For example, when maintaining gaps between 0 V and the power supply voltage VDD to be identical to each other, the RLM controller 11 may be used. The RLM controller 11 may be used to maintain the same level between at least two of the signal levels V1 to V4.

Figure 5A:
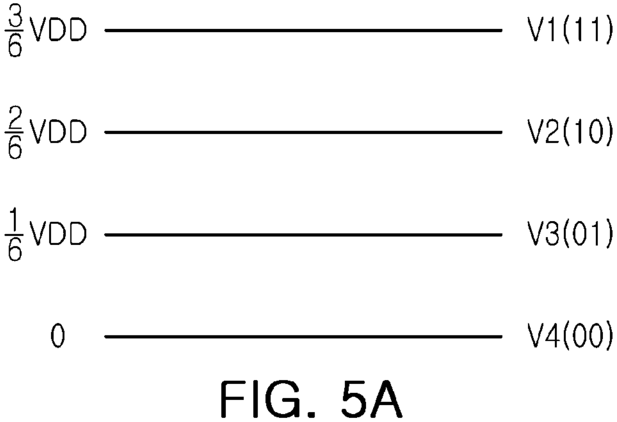
FIGS. 5A to 5C are views conceptually illustrating the operation of the RLM controller 11 according to example embodiments.
Figure 5B:
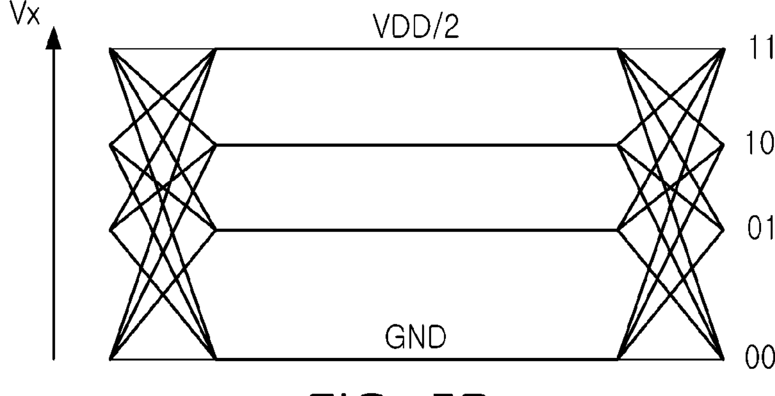

FIGS. 5A and 5B are drawings conceptually illustrating the operation of the RLM controller 11 according to example embodiments.

Referring to FIG. 5A, data corresponding to a signal level of PAM4 signaling is illustrated by way of example. The first signal level (V1) is $$\frac{3}{6}VDD,$$

the second signal level (V2) is $$\frac{2}{6}VDD,$$

the third signal level (V3) is $$\frac{1}{6}VDD,$$

and the fourth signal level (V4) is 0 (or GND). In this case, a resistance value of the termination resistor Ⓡ may be R and a resistance value of the channel CH is 0. In an embodiment, the signal levels V1 to V4 are not limited thereto.

In an example embodiment, data '11' may correspond to the first signal level (V1), data '10' may correspond to the second signal level (V2), data '01' may correspond to the third signal level (V3), and data '00' may correspond to the fourth signal level V4. In an embodiment, it will be understood that each of the signal levels V1 to V4 corresponds to the 2-bit data, but is not limited thereto.

Figure 5C:
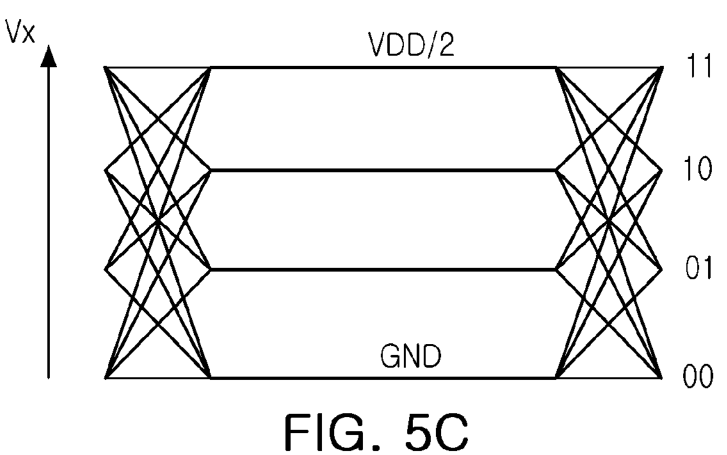

Referring to FIG. 5B, gaps between the signal levels V1 to V4 before RLM control is performed are illustrated. As illustrated in FIG. 5B, when RLM control is not performed, at least one of gaps for discriminating 2-bit data ("11", "10", "01", and "00") may be different from one another. Referring to FIG. 5C, gaps between the signal levels V1 to V4 after RLM control is performed are illustrated. As illustrated in FIG. 5C, when RLM control is performed, gaps for discriminating 2-bit data ("11", "10", "01", and "00") may be maintained to be identical to each other. For example, each of data "11", "10", "01", and "00" may correspond to the signal levels V1, V2, V3, and V4, respectively, and the first adjusted voltage Vx of the first node ND1. According to example embodiments, when the RLM control is performed, the gaps of V1-V2, V2-V3, and V3-V4 may be identical to each other.

Figure 6A:
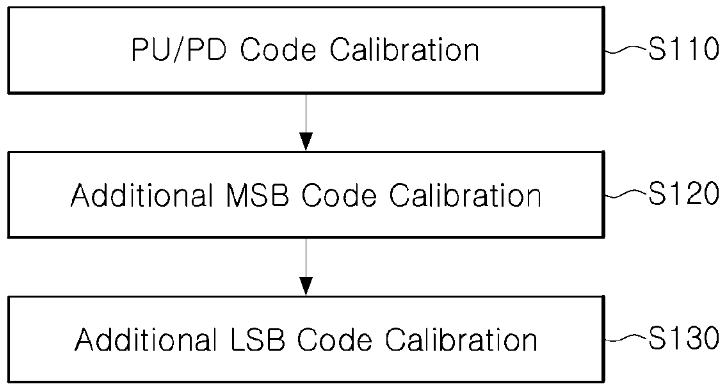
FIGS. 6A and 6B are flowcharts illustrating a method of operating an RLM controller according to example embodiments.
Figure 6B:
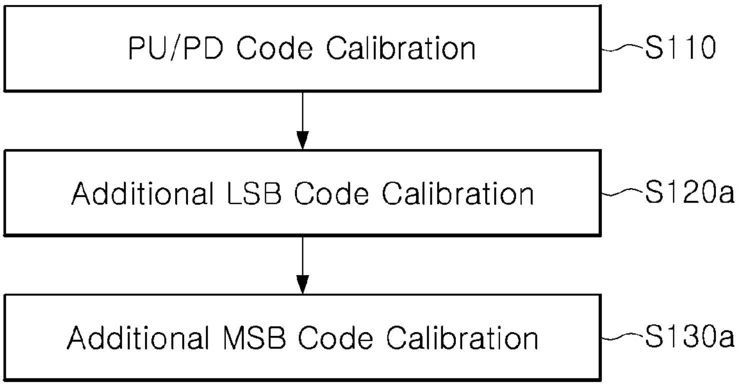

FIGS. 6A and 6B are flowcharts illustrating a method of operating the RLM controller 11 according to example embodiments.

Referring to FIG. 6A, the operation of the RLM controller 11 may be performed as follows. First, pull-up/pull-down code calibration may be performed (S110). This pull-up/pull-down code calibration may include a ZQ calibration. For example, the ZQ calibration may find ½*VDD by updating the pull-up code PUCD of the MSB/LSB pull-up drivers 113 and 114 of FIG. 3. Thereafter, an additional MSB code calibration for the MSB additional code ADD_MSB may be performed (S120) while changing a value of the first reference voltage VREF1 of the RLM controller 110. Thereafter, an additional LSB code calibration for the LSB additional code ADD_LSB may be performed (S130).

Referring to FIG. 6B, in the operation of the RLM controller 110, an additional LSB code calibration may first be performed (S120*a*), compared to that illustrated in FIG. 6A, and then, an additional MSB code calibration may be performed (S130*a*).

Figure 7A:
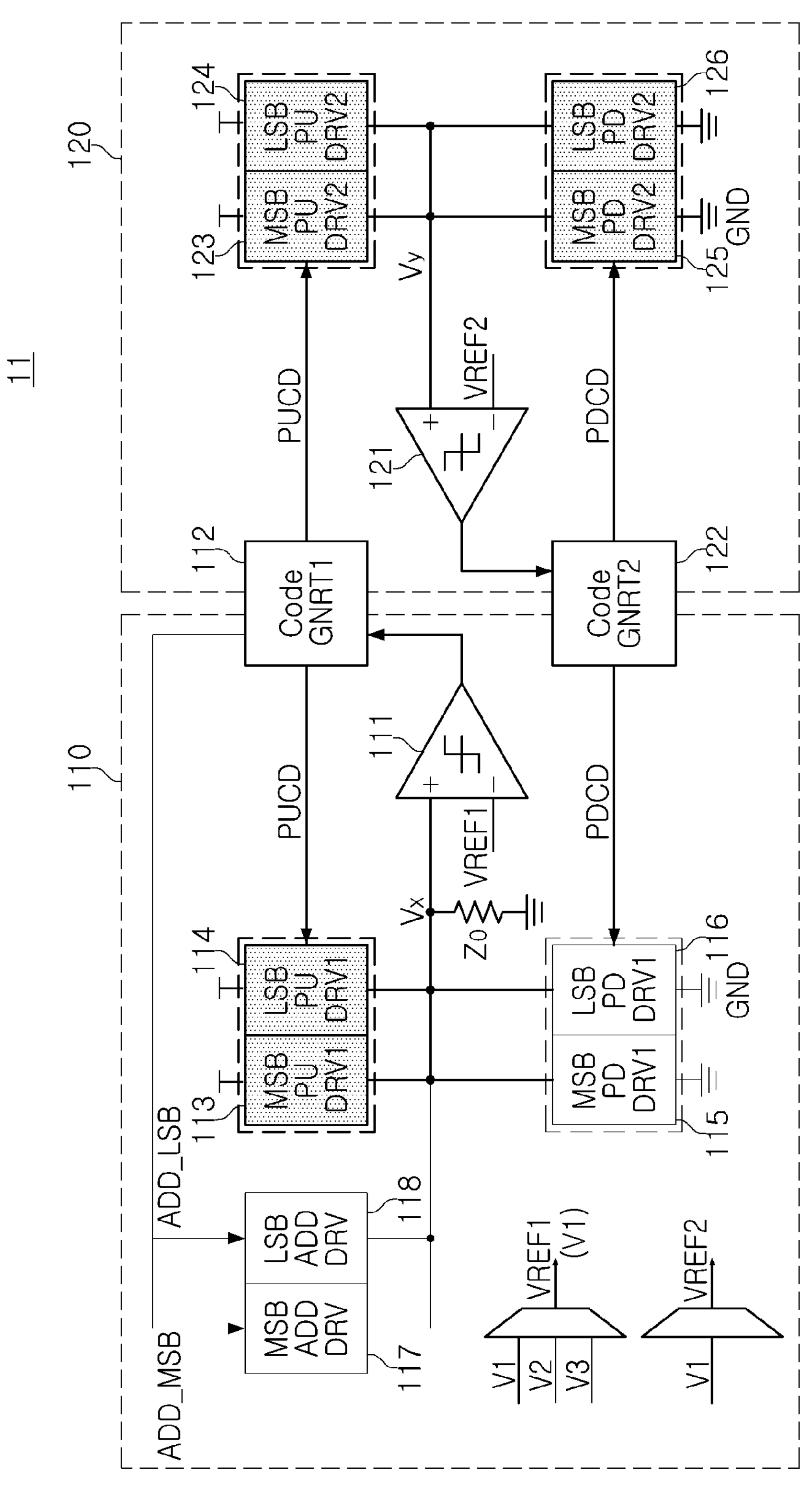
Figure 7B:
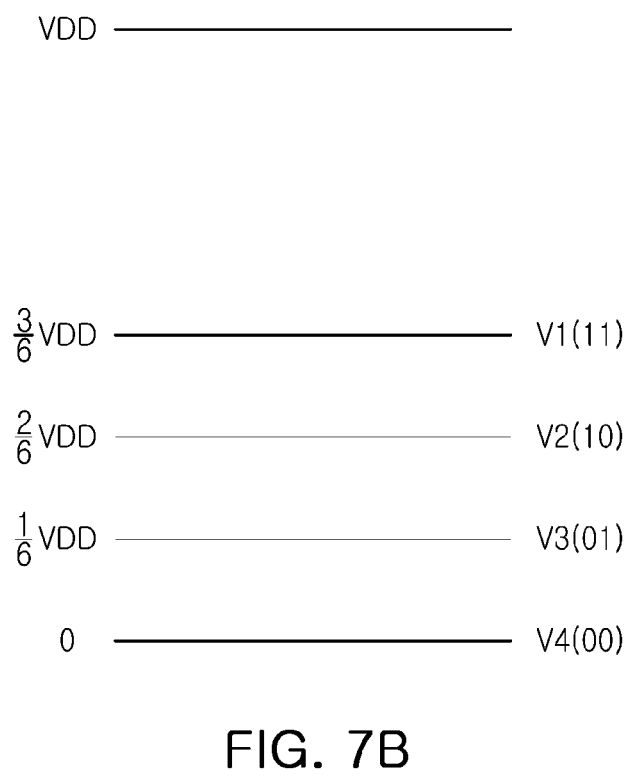

FIGS. 7A and 7B are diagrams illustrating a code generation process of an RLM controller according to example embodiments.

When the first signal level V1 is selected as the first reference voltage VREF1 and the second reference voltage VREF2, the pull-up code calibration and the pull-down code calibration may be performed at the same time. In this case, the MSB pull-up driver 113 and the LSB pull-up driver 114 of the first part circuit 110 may be turned on, the MSB pull-up/pull-down drivers 123 and 125 and the LSB pull-up/pull-down drivers 124 and 126 of the second part circuit 120 may be turned on, and the first MSB pull-down driver 115, the first LSB pull-down driver 116, the MSB additional driver 117, and the LSB additional driver 118 of the first part circuit 110 may be turned off.

In an example embodiment, the calibration of the pull-up code may be ended and then the calibration of the pull-down code may be ended. Accordingly, as illustrated in FIGS. 7A and 7B, the first adjusted voltage Vx may be the first signal level V1 having $$\frac{3}{6}VDD.$$

Figure 8A:
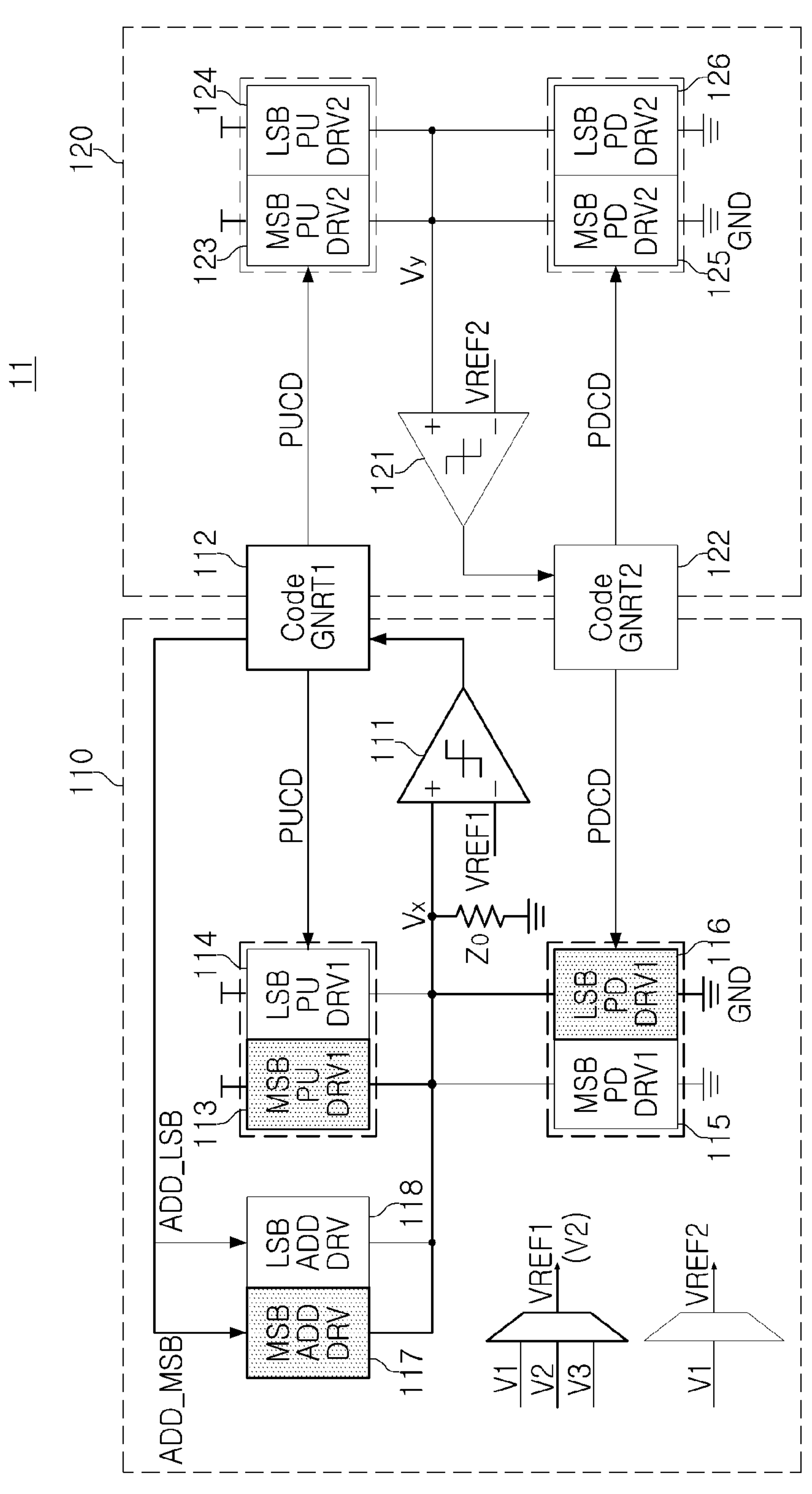
Figure 8B:
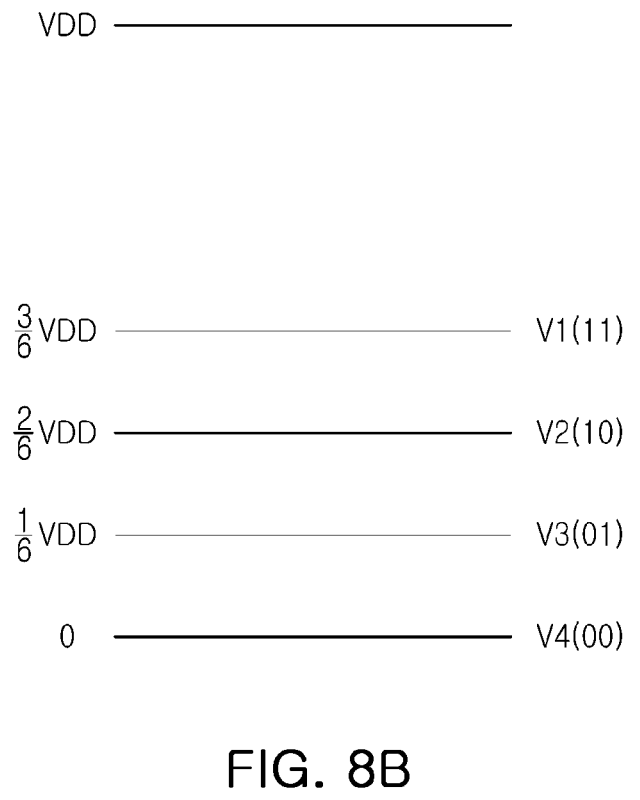

FIGS. 8A and 8B are diagrams illustrating an additional MSB calibration process of an RLM controller 11 according to example embodiments. Referring to FIG. 8A, the first reference voltage VREF1 of the first part circuit 110 is changed to a second signal level V2 ('10' level), the MSB pull-up driver 113 is turned on, the LSB pull-down driver 116 is turned on, and the MSB additional driver 117 is turned on, and in this state, an additional MSB code calibration may be performed. In this case, the LSB pull-up driver 114, the MSB pull-down driver 115, and the LSB additional driver 118 of the first part circuit 110 may be turned off. Accordingly, as illustrated in FIGS. 8A and 8B, the first adjusted voltage Vx may be the second signal level V2 having $$\frac{2}{6}VDD.$$

Figure 9A:
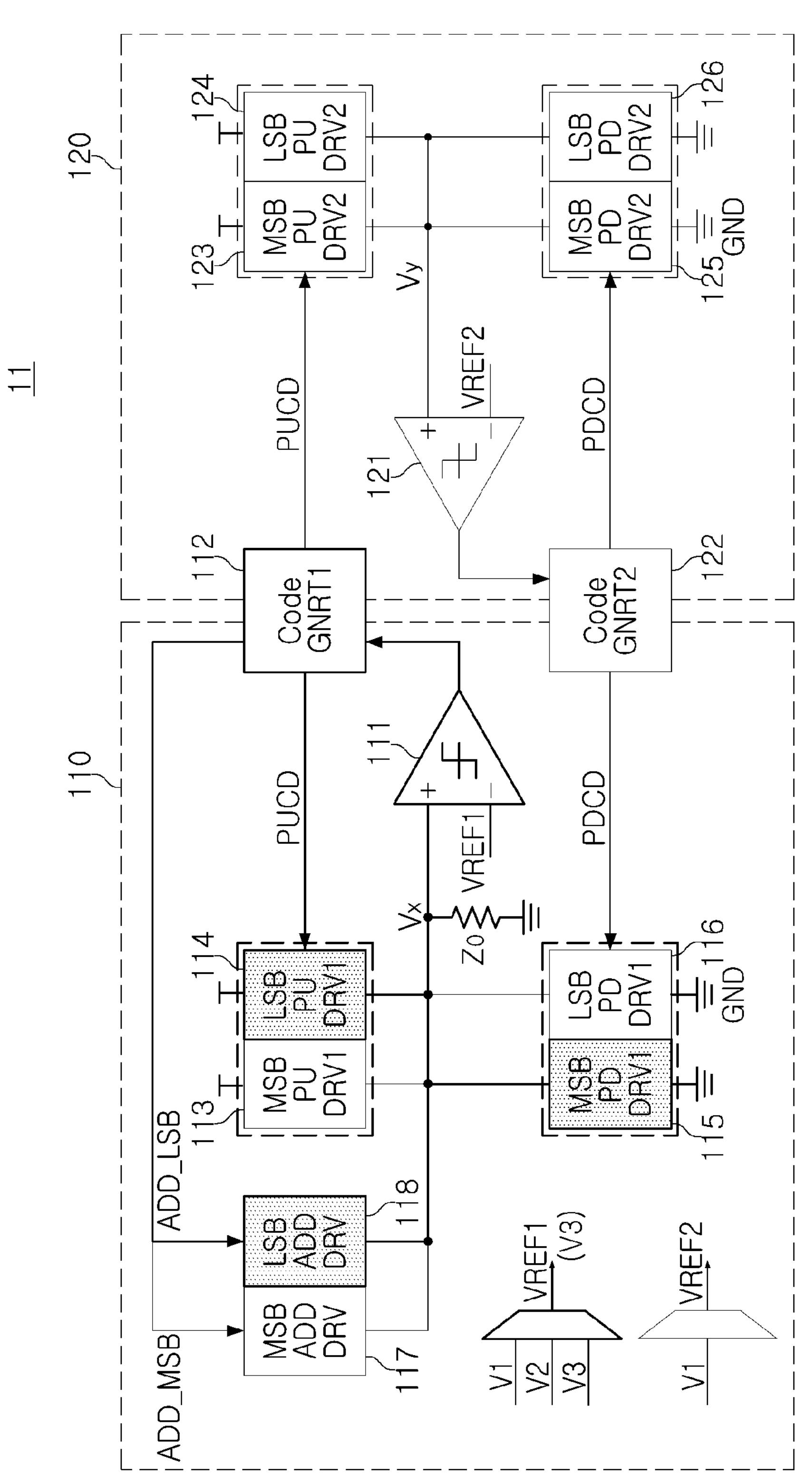
Figure 9B:
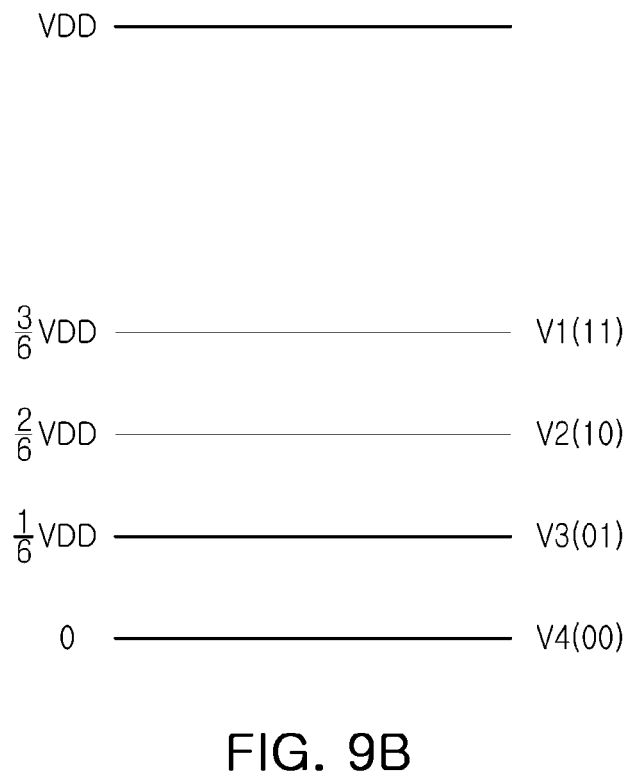

FIGS. 9A and 9B are diagrams illustrating an additional LSB calibration process of an RLM controller according to example embodiments. Referring to FIG. 9A, in a state in which the first reference voltage VREF1 is changed to a third signal level V3 ('01' level), the LSB pull-up driver 114 is turned on, the MSB pull-down driver 115 is turned on, and the LSB additional driver 118 is turned on, and in this state, an additional LSB code calibration may be performed. In this case, the MSB pull-up driver 113, the LSB pull-down driver 116, and the MSB additional driver 117 of the first part circuit 110 may be turned off. Thus, after performing the additional LSB calibration, as illustrated in FIGS. 9A and 9B, the first adjusted voltage Vx may be the third signal level V3 having $$\frac{1}{6}VDD.$$

Figure 10:
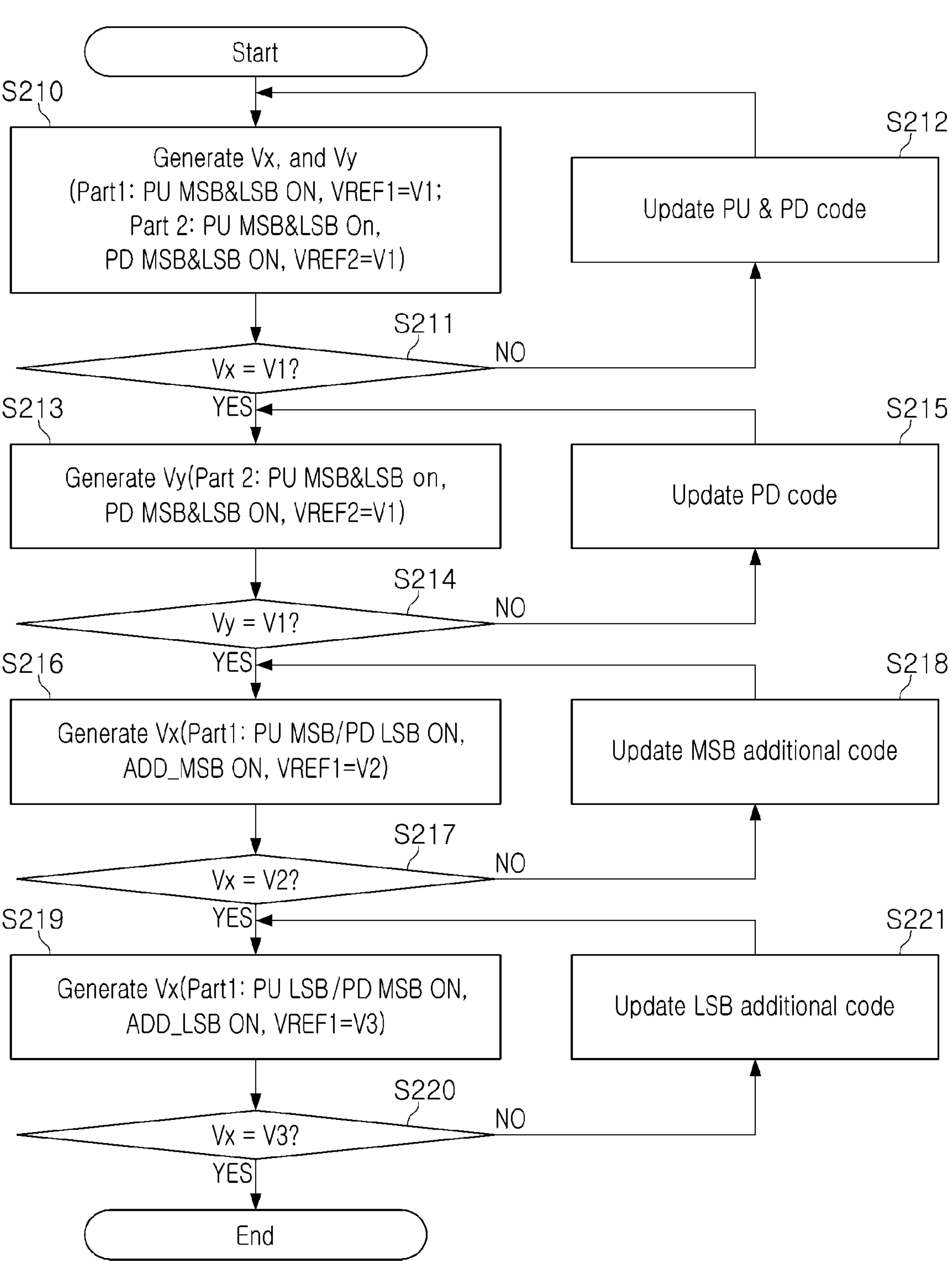
FIG. 10 is a flowchart illustrating an RLM control method of a controller 20 according to an example embodiment.

FIG. 10 is a flowchart illustrating an RLM control method according to an example embodiment.

After setting the first reference voltage VREF1 to the first signal level V1 and the second reference voltage VREF2 to the first signal level V1, the first adjusted voltage Vx and the second adjusted voltage Vy may be generated (S210). At this time, the first MSB and the first LSB pull-up drivers 113 and 114 of the first part circuit 110 may be in a turned-on state, and the second MSB/LSB pull-up/the second MSB/LSB pull-down drivers 123, 124, 125 and 126 of the second part circuit 120 may be in a turned-on state.

Thereafter, it may be determined whether the first adjusted voltage Vx is the first signal level V1 in the first comparator 111 (S211). For example, when the first adjusted voltage Vx is not the first signal level V1, the pull-up/pull-down codes PUCD and PDCD are updated (S212), and then, operation S210 may be repeatedly performed.

For example, when the first adjusted voltage Vx is the first signal level V1, the second MSB/LSB pull-up/the second MSB/LSB pull-down drivers 123, 124, 125 and 126 of the second part circuit 120 are turned on, and the second reference voltage VREF2 is set to the first signal level V1, and then, a second adjusted voltage Vy may be generated (S213).

Thereafter, it may be determined whether the second adjusted voltage Vy is the first signal level V1 in the second comparator 121 (S214). For example, when the second adjusted voltage Vy is not the first signal level V1, the pull-down code PDCD is updated (S215), and operation S213 may be repeatedly performed.

For example, when the second adjusted voltage Vy is the first signal level V1, the first reference voltage VREF1 is set to the second signal level V2, and the first MSB pull-up driver 113 and the first LSB pull-down driver 116 of the first part circuit 110 are turned on, and the MSB additional driver 117 is turned on, and then, a first adjusted voltage Vx may be generated (S216).

Thereafter, it may be determined whether the first adjusted voltage Vx is the second signal level V2 in the first comparator 111 (S217). For example, when the first adjusted voltage Vx is not the second signal level V2, the MSB additional code ADD_MSB is updated (S218), and operation S216 may be repeatedly performed.

For example, when the first adjusted voltage Vx is the second signal level V2, the first reference voltage VREF1 is set to the third signal level V3, and the first LSB pull-up driver 114 and the first MSB pull-down driver 115 of the first part circuit 110 are turned on and the LSB additional driver 118 is turned on, and then, the first adjusted voltage Vx may be generated (S219).

Thereafter, it may be determined whether the first adjusted voltage Vx is the third signal level V3 in the first comparator 111 (S220). For example, when the first adjusted voltage Vx is not the third signal level V3, the LSB additional code ADD_LSB is updated (S221), and operation S219 may be repeatedly performed.

For example, when the first adjusted voltage Vx is the third signal level V3, the RLM control operation may be completed.

In the PAM4 RLM calibration according to an example embodiment, ZQ calibration may be preferentially performed. This ZQ calibration may find ½*VDD by updating the code of the pull-up driver connected to the external resistor $Z_0$ in the first part circuit 110. At this time, the pull-down driver in the first part circuit 110 is in a turn-off state, and the first reference voltage has a first signal level (VREF1=V1). While searching for the pull-up code PUCD in this manner, the second part circuit 120 may be received the same pull-up code to find a pull-down code PDCD. Therefore, the pull-up/pull-down code calibration may be performed simultaneously. Accordingly, the calibration time may be shortened.

When the calibration of the pull-up/pull-down codes is finished, the value of the first reference voltage (VREF1) may be changed by using a multiplexer (e.g., the first selector 131 in FIG. 4A), and the calibrations of the MSB additional code/the LSB additional code may be respectively performed.

In some example, the RLM controller 11 illustrated in FIG. 3 performs calibration by changing the reference voltage in one comparator according to the mode by using a multiplexer. However, the present inventive concept need not be limited thereto. The RLM controller 11 according to an example embodiment of the present inventive concept may also be implemented using different reference voltages in a plurality of comparators.

Figure 11:
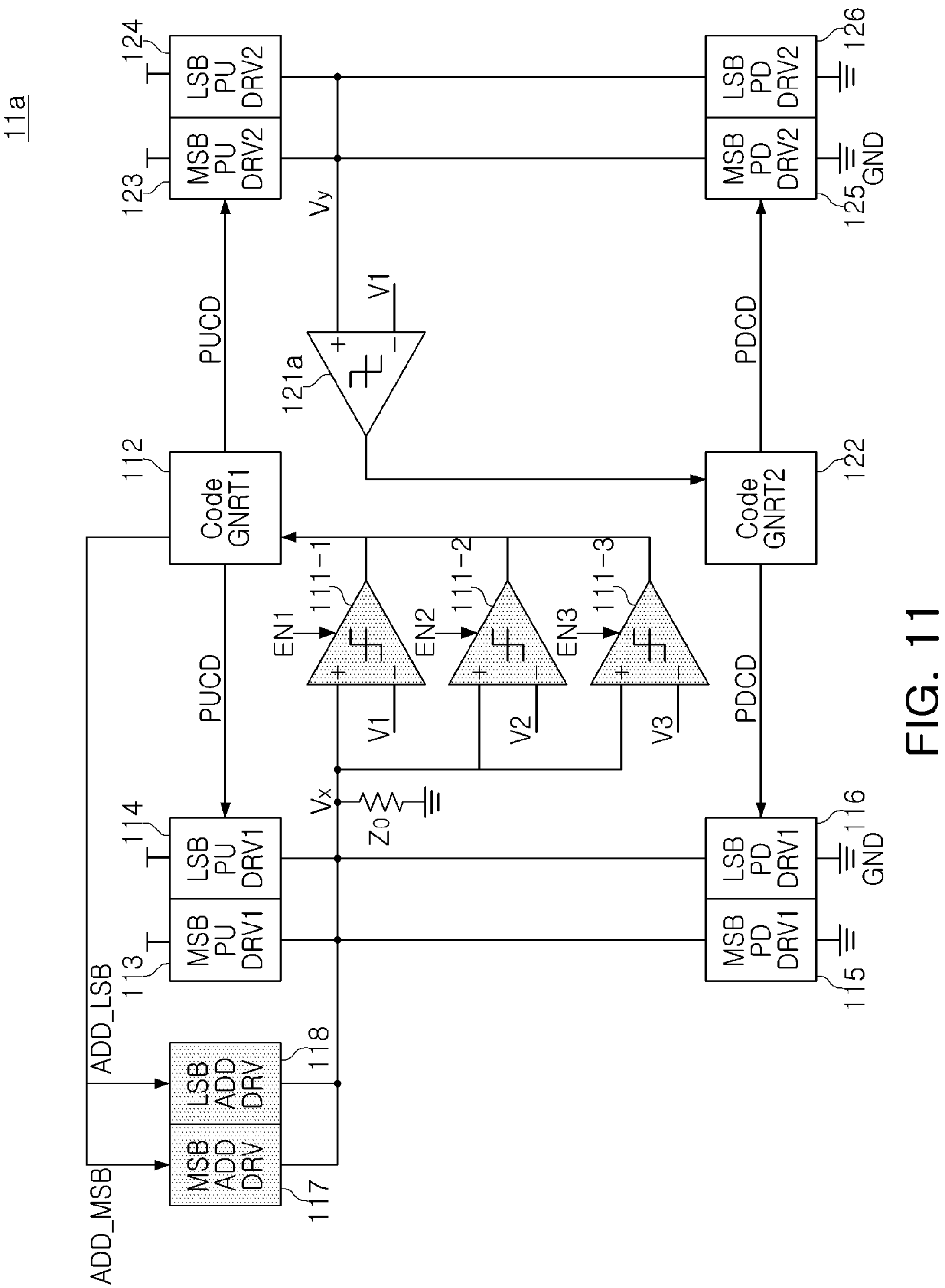
FIG. 11 is a diagram illustrating an RLM controller according to example embodiments.

FIG. 11 is a diagram illustrating an RLM controller 11*a* according to example embodiments. Referring to FIG. 11, the RLM controller 11*a* has a difference in that it includes a plurality of first comparators 111-1, 111-2 and 111-3, compared to the RLM controller 11 illustrated in FIG. 3. Each of the first comparators 111-1, 111-2 and 111-3 compares the first adjusted voltage Vx and the corresponding signal level (one of V1, V2 and V3), and may output a first comparison voltage. A second comparator 121*a* may compare the second adjusted voltage Vy to the first signal level V1 and output a second comparison voltage.

In an example embodiment, the first comparators 111-1, 111-2 and 111-3 may be sequentially activated in response to corresponding activation signals EN1, EN2, and EN3. For example, when one of the first comparators 111-1, 111-2, and 111-3 is activated, the remaining comparators may be deactivated.

In an example embodiment, each of the MSB additional driver 117 and the LSB additional driver 118 may include a pull-up driver or a pull-down driver. In an example embodiment, the pull-up driver may include pull-up transistors connected between the power supply terminal VDD and the first node ND1 in parallel. In this case, each of the pull-up transistors may be implemented as a PMOS transistor or an NMOS transistor. In an example embodiment, the pull-down driver may include pull-down transistors connected between the first node ND1 and the ground terminal GND in parallel.

In this case, each of the pull-down transistors may be implemented as an NMOS transistor.

In example embodiments, the RLM calibration may be performed according to a training request from a host.

Figure 12:
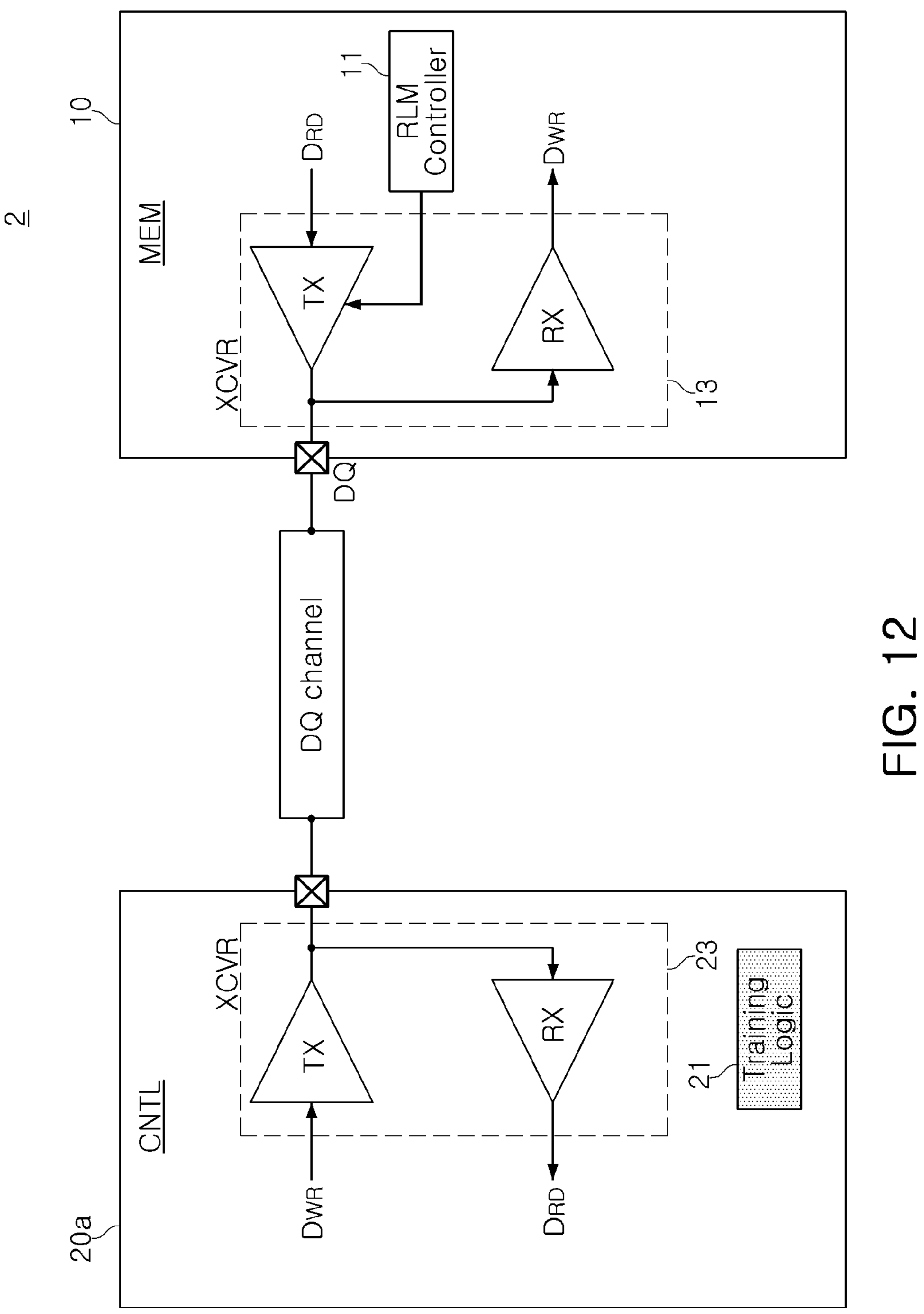
FIG. 12 is a diagram illustrating a memory system according to example embodiments.

FIG. 12 is a diagram illustrating a memory system 2 according to example embodiments. Referring to FIG. 12, the memory system 2 differs from the memory system 1 illustrated in FIG. 1 in that the memory system 2 has a controller CNTL 20*a* having a training logic 21 requesting RLM control.

Figure 13:
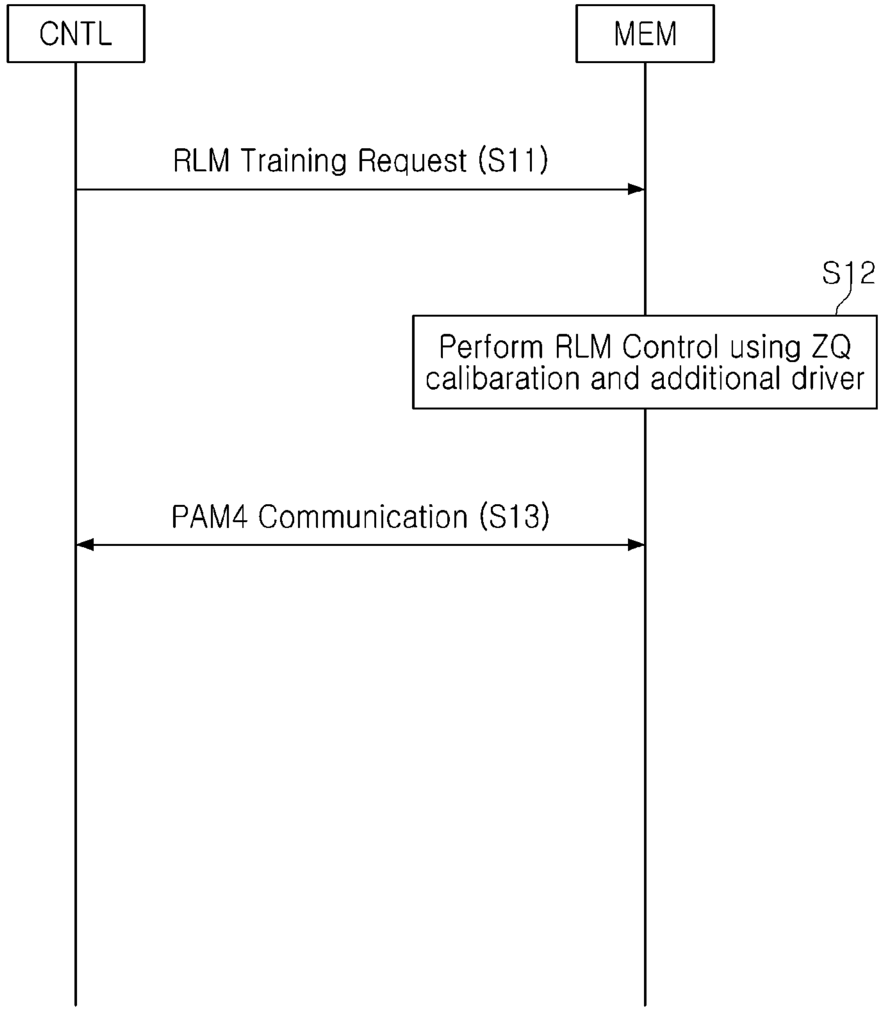
FIG. 13 is a ladder diagram illustrating an RLM control process according to an example embodiment.

FIG. 13 is a ladder diagram illustrating an RLM control process according to an example embodiment. Referring to FIG. 13, the RLM control process may be performed as follows. The controller CNTL may transmit RLM training request to a memory device MEM in response to the host request (S11). The memory device MEM may perform RLM calibration using ZQ calibration and an additional driver in response to the RLM training request (S12). Thereafter, the memory device MEM and the controller CNTL may perform communication using PAM4 signaling (S13).

Figure 14:
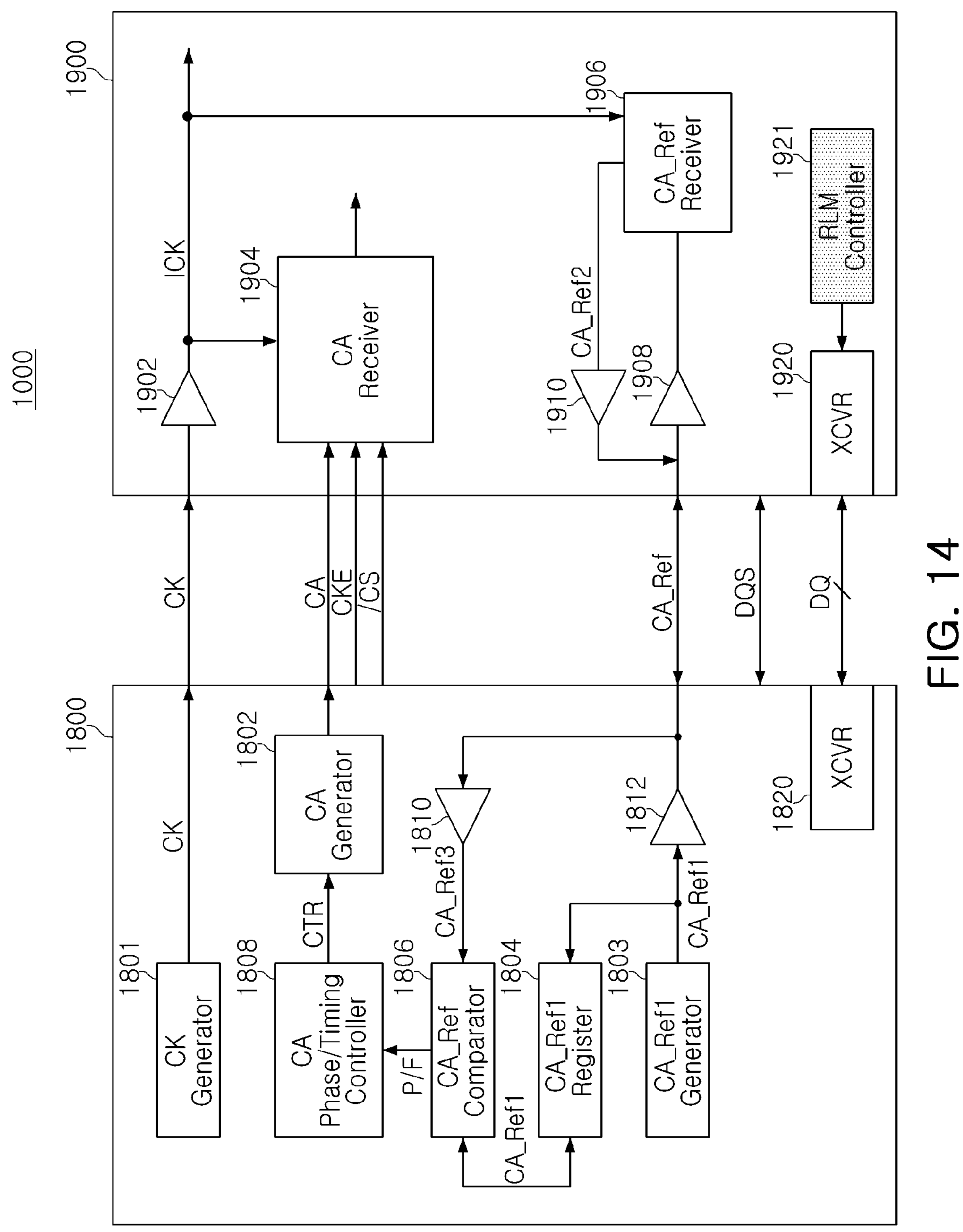
FIG. 14 is a diagram illustrating a memory system performing at least one command/address calibration according to an example embodiment.

FIG. 14 is a diagram illustrating a memory system 1000 performing at least one command/address calibration according to an example embodiment.

Referring to FIG. 14, the memory system 1000 may include a controller 1800 and a memory device 1900. The controller 1800 may include a clock generator 1801, a command/address (CA) generator 1802, a command/address reference generator 1803, a register 1804, a comparator 1806, a phase/timing controller 1808, and first and second reference signal drivers 1810 and 1812. The controller 1800 may provide a clock signal CK generated by the clock generator 1801 to the memory device 1900 through a clock signal line.

In an example embodiment, the memory system 1000 separately includes a command/address reference signal (CA_Ref) line in the interface. The command/address reference signal (CA_Ref) line may serve to transmit/receive a command/address reference signal CA_Ref, which is a reference value of the command/address, in a calibration mode.

The calibration result value using the reference value of the command/address is provided to the phase/timing controller 1808 to adjust the phase/timing of the command/address signal CA. Since there is a separate command/address reference signal (CA_Ref) line, a calibration operation that may adjust the phase/timing of the command/address signal CA may be performed simultaneously with performing the operation of transmitting the command/address signal CA.

The CA generator 1802 may generate a command/address signal CA of which phase or timing is adjusted in response to a control signal CTR of the phase/timing controller 1808, and may transmit the adjusted command/address signal CA to the memory device 1900 through a CA line. For example, the CA generator 1802 may generate the command/address signal CA in response to a clock signal CK generated from the clock generator 1801.

The command/address reference generator 1803 is configured in the same manner as the command/address generator 1802, and may generate a first command/address reference signal CA_Ref1 identical to the command/address signal CA generated from the command/address generator 1802.

The first command/address reference signal CA_Ref1 is provided to the register 1804. Also, the first command/address reference signal CA_Ref1 is transmitted to the CA_Ref line through the second reference signal driver 1812 and provided to the memory device 1900 through the CA_Ref line.

The register 1804 may store the first command/address reference signal CA_Ref1. The comparator 1806 may compare the first command/address reference signal CA_Ref1 stored in the register 1804 to a third command/address reference signal CA_Ref3 output from the first reference signal driver 1810. The comparator 1806 may generate a pass or fail signal P/F by comparing the first command/address reference signal CA_Ref1 to the third command/address reference signal CA_Ref3.

The phase/timing controller 1808 may generate the control signal CTR indicating a phase shift of the command/address signal CA according to the pass or fail signal P/F of the comparator 1806. The control signal CTR may adjust the phase or timing of the command/address signal CA to generate a phase-adjusted command/address signal CA.

The first reference signal driver 1810 receives a second command/address reference signal CA_Ref2 transmitted through the CA_Ref line from the memory device 1900 and transmits the received signal to the comparator 1806 as the third command/address reference signal CA_Ref3.

The second reference signal driver 1812 may receive the first command/address reference signal CA_Ref1 generated by the command/address reference generator 1803 and may transmit the received signal to the CA_Ref line.

The memory device 1900 may include a clock buffer 1902, a command/address (CA) receiver 1904, a command/address reference receiver 1906, and third and fourth reference signal drivers 1908 and 1910. The clock buffer 1902 may generate an internal clock signal ICK by receiving the clock signal CK transmitted through the clock signal line. The CA receiver 1904 may receive a chip select signal/CS, a clock enable signal CKE, and a command/address signal CA transmitted through the CA line in response to the internal clock signal ICK.

The clock enable signal CKE may be used as a pseudo command acting as a read command of the command/address signal CA transmitted through the CA line. The CA receiver 1904 may receive the command/address signal CA when the clock enable signal CKE is activated.

The third reference signal driver 1908 may receive the first command/address reference signal CA_Ref1 transmitted from the controller 1800 through the CA_Ref line and transmit the received signal to the command/address reference receiver 1906. The command/address reference receiver 1906 may be configured in the same manner as the CA receiver 1904. The command/address reference receiver 1906 may receive the chip select signal/CS, the clock enable signal CKE and the first command/address reference signal CA_Ref1 transmitted through the CA_Ref line, in response to the internal clock signal ICK, to transmit the second command/address reference signal CA_Ref2.

The second command/address reference signal CA_Ref2 may be the same as a signal that is output from the CA receiver 1904 by receiving the chip select signal (/CS), the clock enable signal (CKE), and the command/address signal CA transmitted through CA line, in response to the internal clock signal ICK. The second command/address reference signal CA_Ref2 may be transmitted to the CA_Ref line through the fourth reference signal driver 1910.

The CA calibration performed in the memory system 1000 is as follows. The CA generator 1802 of the controller 1800 adjusts the phase or timing of the command/address signal CA in response to the control signal CTR of the phase/timing controller 1808 to transmit the command/ address signal CA to the CA line. The command/address reference generator 1803 may generate the same first command/address reference signal CA_Ref1 as the command/address signal CA and may transmit the generated signal to the CA_Ref line.

The CA reference receiver 1906 of the memory device 1900 receives the first command/address reference signal CA_Ref1 according to the internal clock signal ICK and the clock enable signal CKE, and may generate the second command/address reference signal CA_Ref2. The second command/address reference signal CA_Ref2 of the memory device 1900 may be transmitted to the controller 1800 through the CA_Ref line.

The controller 1800 may transmit the second command/address reference signal CA_Ref2 that is transmitted through the CA_Ref line, to the comparator 1806 as the third command/address reference signal CA_Ref3. The comparator 1806 may generate a pass or fail signal P/F by comparing the first command/address reference signal CA_Ref1 and the third command/address reference signal CA_Ref3. The phase/timing controller 1808 may generate a control signal CTR indicating a phase shift of the command/address signal CA according to the pass or fail signal P/F of the comparator 1806. The CA generator 1802 may generate a command/address signal CA of which the phase is adjusted according to the control signal CTR.

By repetition of the CA calibration operation, the phase/timing controller 1808 of the controller 1800 determines the middle of the passed (P) positions as the middle of the command/address signal (CA) window, and the command/address signal CA may be generated such that the middle of the command/address signal (CA) window comes to the edge of the clock signal CK, and may provide the generated signal to the memory device 1900. Accordingly, the memory device 1900 receives the command/address signal CA in which the middle of the effective window is located at the rising/falling edge of the clock signal pair CK and CKB at the rising/falling edge of the clock signal CK.

The memory system 1000 according to an example embodiment may include transceivers 1820 and 1920 that are disposed in the controller 1800 and the memory device 1900, respectively. In an example embodiment, the transceivers 1820 and 1920 may respectively select one of an NRZ mode or a PAM4 mode through a plurality of data lines DQ in real time, and transmit data in the selected mode. In detail, the transceiver 1920 of the memory device 1900 may perform PAM4 transmission while maintaining the gaps between signal levels to be identical under the control of the RLM controller 1921. The RLM controller 1921 may be identical to the RLM controller described in FIGS. 1, 2A to 2C, 3, 4A, 4B, 5A to 5C, 6A, 6B, 7A, 7B, 8A, 8B, 9A, 9B, and 10 to 13 and will not be described in further detail.

In example embodiments, the RLM control method according to an example embodiment may be applied inside a stacked memory package chip.

Figure 15:
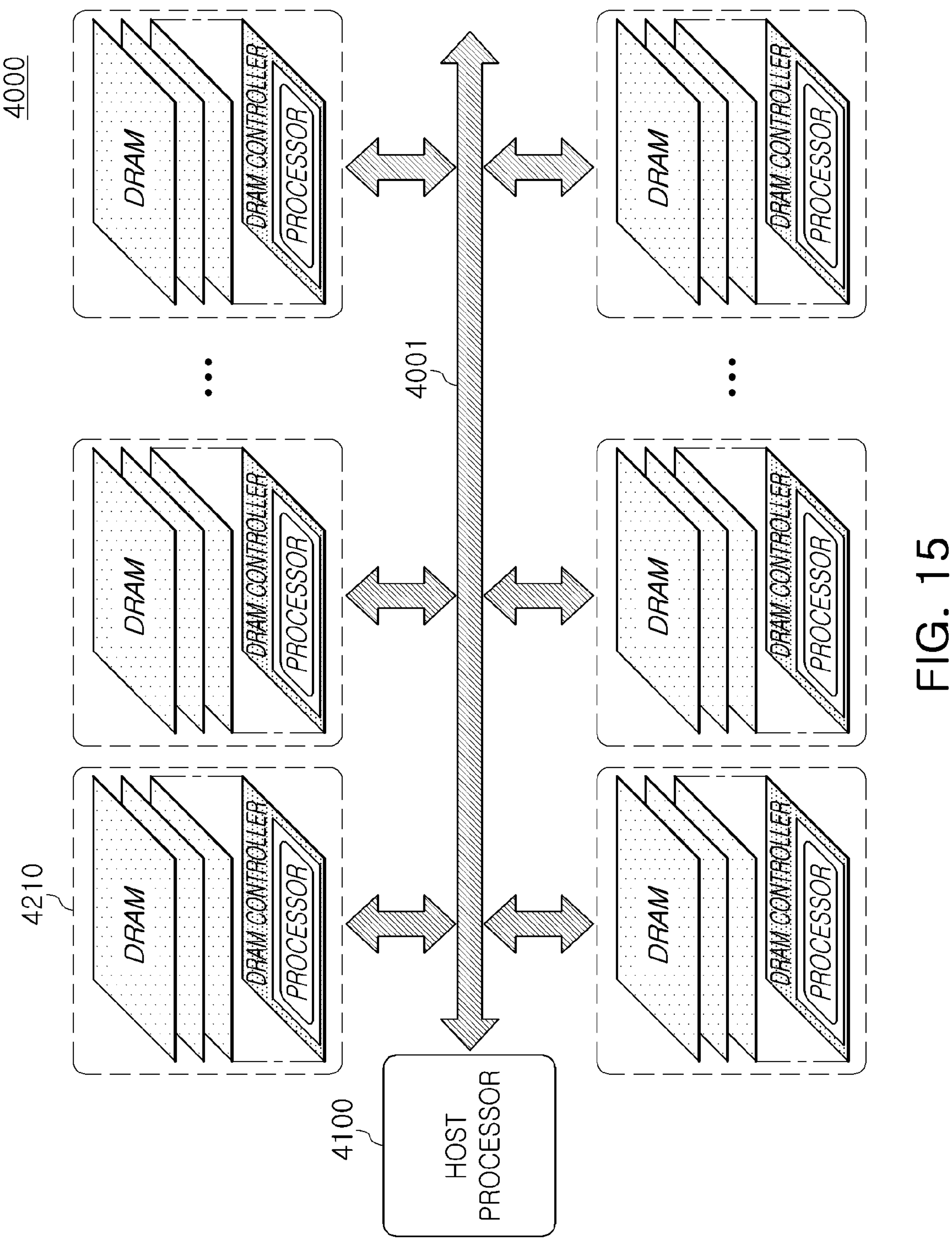
FIG. 15 is a diagram illustrating a computing system according to example embodiments.

FIG. 15 is a diagram illustrating a computing system 4000 according to example embodiments. Referring to FIG. 15, the computing system 4000 may include a host processor 4100 and at least one semiconductor package 4210 controlled by the host processor 4100.

In an example embodiment, the host processor 4100 and the semiconductor package 4210 may transmit and receive data through a channel 4001.

The semiconductor package 4210 may include stacked memory chips and a controller chip. As illustrated in FIG. 15, the semiconductor package 4210 may include a plurality of DRAM chips formed on a DRAM controller chip. For example, it should be understood that the configuration of the semiconductor package according to an example embodiment is not limited thereto. Each of the plurality of DRAM chips may perform the RLM calibration as described in FIGS. 1, 2A to 2C, 3, 4A, 4B, 5A to 5C, 6A, 6B, 7A, 7B, 8A, 8B, 9A, 9B, and 10 to 13.

In an example embodiment, a signaling mode between the stacked memory chips and the controller chip of the semiconductor package 4210 may vary according to an internal channel environment. In an example embodiment, a signaling mode between the host processor 4100 and the semiconductor package 4210 may vary in real time according to a channel environment.

Figure 16:
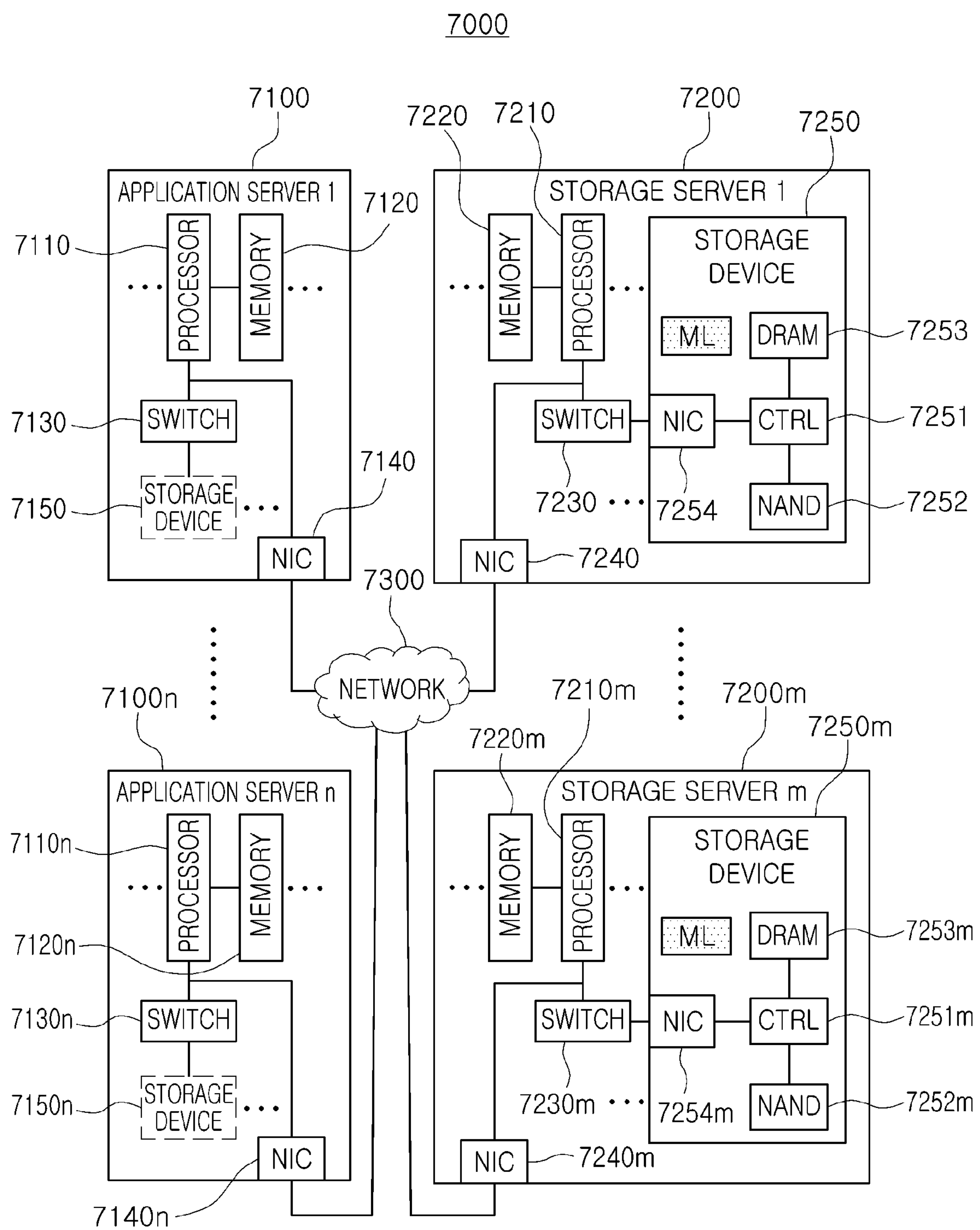
FIG. 16 is a diagram illustrating a data center to which a memory device according to an example embodiment is applied.

FIG. 16 is a diagram illustrating a data center to which a memory device according to an example embodiment is applied. Referring to FIG. 16, a data center 7000 is a facility collecting various types of data and providing services, and may be referred to as a data storage center. The data center 7000 may be a system for operating a search engine and a database, and may be a computing system used by a company such as a bank or a government institution. The data center 7000 may include application servers 7100 to 7100*n* and storage servers 7200 to 7200*m*. The number of application servers 7100 to 7100*n* and the number of storage servers 7200 to 7200*m* may be variously selected according to example embodiments, and the number of application servers 7100 to 7100*n* and the number of the storage servers 7200 to 7200*m* may be different.

The application server 7100 or the storage server 7200 may include at least one of processors 7110 and 7210 and memories 7120 and 7220. In describing the storage server 7200 as an example, the processor 7210 may control the overall operation of the storage server 7200, access the memory 7220 and execute commands or data loaded in the memory 7220. The memory 7220 may be a Double Data Rate Synchronous DRAM (DDR SDRAM), High Bandwidth Memory (HBM), Hybrid Memory Cube (HMC), Dual In-line Memory Module (DIMM), Optane DIMM or Non-Volatile DIMM (NVDIMM). Depending on example embodiments, the number of processors 7210 and the number of memories 7220 included in the storage server 7200 may be variously selected.

In an example embodiment, the processor 7210 and the memory 7220 may provide a processor-memory pair. In an example embodiment, the number of the processor 7210 and the memory 7220 may also be different. The processor 7210 may include a single core processor or a multicore processor. The description of the storage server 7200 may be similarly applied to the application server 7100. Depending on example embodiments, the application server 7100 may not include a storage device 7150. The storage server 7200 may include at least one storage device 7250. The storage device 7250 may be implemented to vary a signaling mode according to a channel environment. Also, the storage device 7250 may be implemented to perform RLM calibration corresponding to multilevel signaling as described in FIGS. 1, 2A to 2C, 3, 4A, 4B, 5A to 5C, 6A, 6B, 7A, 7B, 8A, 8B, 9A, 9B, and 10 to 15.

The application servers 7100 to 7100*n* and the storage servers 7200 to 7200*m* may communicate with each other through a network 7300. The network 7300 may be implemented using a Fiber Channel (FC) or Ethernet. In this case, the FC is a medium used for relatively high-speed data transmission, and an optical switch providing high performance/high availability may be used. The storage servers 7200 to 7200m may be provided as file storage, block storage, or object storage depending on an access method of the network 7300.

In an example embodiment, the network 7300 may be a storage-only network such as a storage area network (SAN). For example, the SAN may be an FC-SAN that uses an FC network and is implemented according to FC Protocol (FCP). In some example, the SAN may be an IP-SAN that uses a TCP/IP network and is implemented according to an iSCSI (SCSI over TCP/IP or Internet SCSI) protocol. In example embodiments, the network 7300 may be a general network such as a TCP/IP network. For example, the network 7300 may be implemented according to protocols such as FC over Ethernet (FCoE), Network Attached Storage (NAS), and NVMe over Fabrics (NVMe-oF).

In the following, descriptions will be made focusing on the application server 7100 and the storage server 7200. The description of the application server 7100 may be applied to other application servers 7100n, and the description of the storage server 7200 may be applied to other storage servers 7200m.

The application server 7100 may store data requested to be stored by a user or a client in one of the storage servers 7200 to 7200m through the network 7300. In addition, the application server 7100 may acquire data requested by a user or a client to read from one of the storage servers 7200 to 7200m, through the network 7300. For example, the application server 7100 may be implemented as a web server or a database management system (DBMS).

The application server 7100 may access the memory 7120n or the storage device 7150n included in the other application server 7100n through the network 7300, or may access the memories 7220 to 7220m or the storage devices 7250 to 7250m included in the storage servers 7200 to 7200m, through the network 7300. Accordingly, the application server 7100 may perform various operations on data stored in the application servers 7100 to 7100n or the storage servers 7200 to 7200m. For example, the application server 7100 may execute a command for moving or copying data between the application servers 7100 to 7100n or the storage servers 7200 to 7200m. At this time, the data may be transmitted from the storage devices 7250 to 7250m of the storage servers 7200 to 7200m through the memories 7220 to 7220m of the storage servers 7200 to 7200m, or may be moved directly to the memory 7120 to 7120n of the application servers 7100 to 7100n. Data moving through the network 7300 may be encrypted data for security or privacy.

Referring to the storage server 7200 as an example, an interface 7254 may provide a physical connection between the processor 7210 and a controller 7251 and a physical connection between an NIC 7240 and the controller 7251. For example, the interface 7254 may be implemented in a Direct Attached Storage (DAS) method in which the storage device 7250 is directly connected with a dedicated cable. In addition, for example, the interface 1254 may be implemented in various interface methods, such as an Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), compact flash (CF) card interface, and the like.

The storage server 7200 may further include a switch 7230 and the NIC 7240. The switch 7230 may selectively connect the processor 7210 and the storage device 7250 or may selectively connect the NIC 7240 and the storage device 7250 according to the control of the processor 7210.

In an example embodiment, the NIC 7240 may include a network interface card, a network adapter, and the like. The NIC 7240 may be connected to the network 7300 through a wired interface, a wireless interface, a Bluetooth interface, an optical interface, or the like. The NIC 7240 may include an internal memory, a DSP, a host bus interface, and the like, and may be connected to the processor 7210 or the switch 7230 through a host bus interface. The host bus interface may be implemented as one of the examples of the interface 7254 described above. In an example embodiment, the NIC 7240 may be integrated with at least one of the processor 7210, the switch 7230, and the storage device 7250.

In the storage server 7200 to 7200m or application server 7100 to 7100n, the processor sends a command to the storage device (7150 to 7150n or 7250 to 7250m) or memory (7120 to 7120n or 7220 to 7220m) to program or read data. In this case, the data may be data that is error-corrected through an Error Correction Code (ECC) engine. The data is data that has been processed by Data Bus Inversion (DBI) or Data Masking (DM), and may include Cyclic Redundancy Code (CRC) information. The data may be encrypted data for security or privacy.

The storage devices 7150 to 7150m and 7250 to 7250m may transmit a control signal and a command/address signal to NAND flash memory devices 7252 to 7252m in response to a read command received from the processor. Accordingly, when data is read from the NAND flash memory devices 7252 to 7252m, a read enable (RE) signal is input as a data output control signal, and may serve to output data to the DQ lines. Data Strobe (DQS) may be generated by using the RE signal. The command and address signals may be latched in a page buffer according to the rising edge or falling edge of the Write Enable (WE) signal.

The controller 7251 may overall control the operation of the storage device 7250. In an example embodiment, the controller 7251 may include a static random access memory (SRAM). The controller 7231 may write data to the NAND flash 7252 in response to a write command, or read data from the NAND flash 7252 in response to a read command. For example, the write command or read command may be provided from the processor 7210 in the storage server 7200, the processor 7210m in other storage server 7200m, or the processors 7110 and 7110n in the application servers 7100 and 7100n. A DRAM 7253 may temporarily store (or, buffer) data to be written to the NAND flash 7252 or data read from the NAND flash 7252. Also, the DRAM 7253 may store meta data. In this case, the metadata is user data or data generated by the controller 7251 to manage the NAND flash 7252. The storage device 7250 may include a Secure Element (SE) for security or privacy.

In example embodiments, FIGS. 1, 2A to 2C, 3, 4A, 4B, 5A to 5C, 6A, 6B, 7A, 7B, 8A, 8B, 9A, 9B, and 10 to 16 illustrate an RLM controller applied to a memory device. However, the present inventive concept need not be limited thereto. The RLM controller according to example embodiments may be applied to any device having a data transmission device performing communication.

Figure 17:
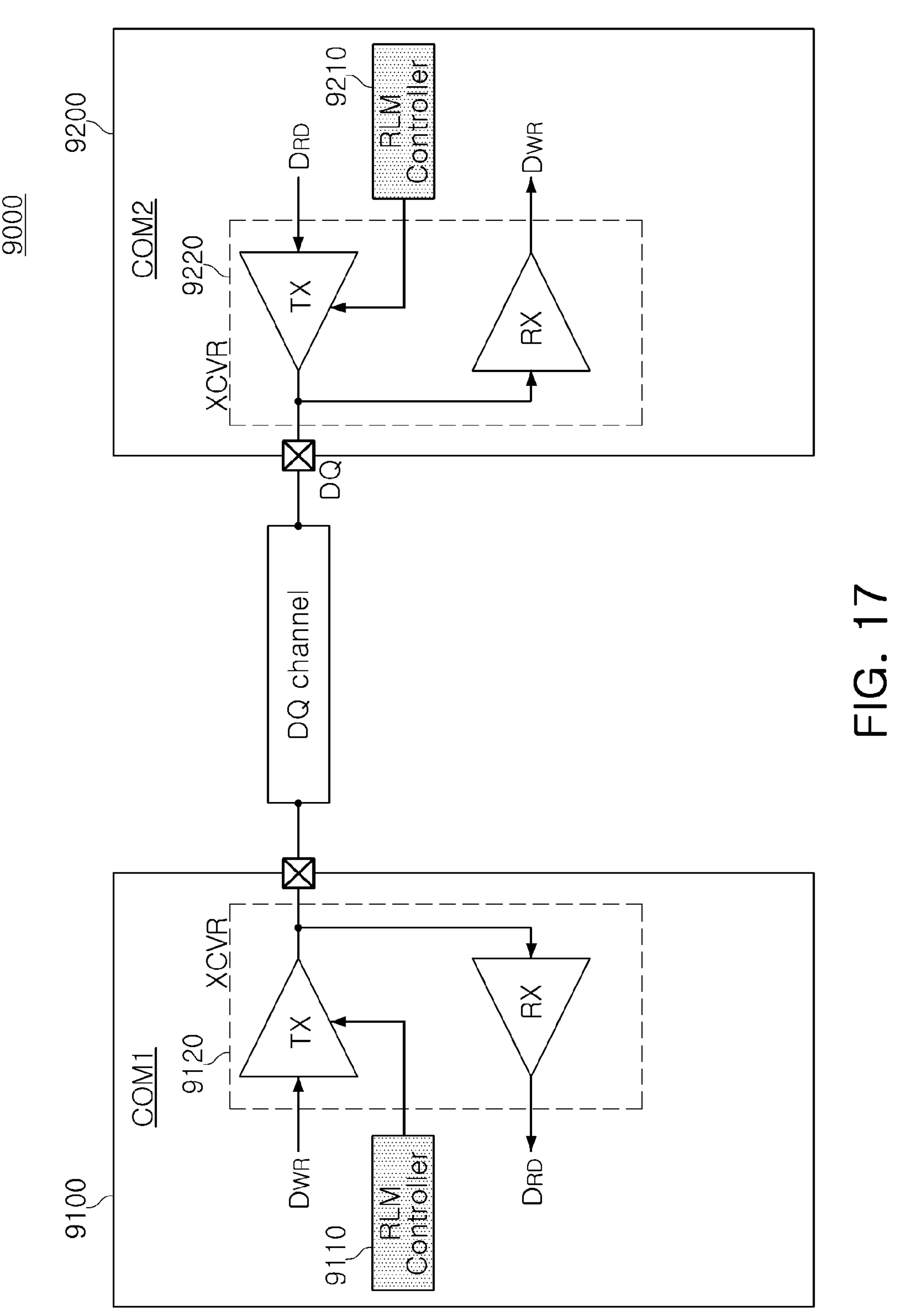
FIG. 17 is a diagram illustrating a communication system according to an example embodiment.

FIG. 17 is a diagram illustrating a communication system 9000 according to an example embodiment. Referring to FIG. 17, the communication system 9000 may include a first communication device 9100 and a second communication device 9200. A transceiver 9120 of the first communication device 9100 and a transceiver 9220 of the second communication device 9200 may perform data communication by a multilevel signaling method. Referring to FIG. 17, a RLM controller 9110 may be included in the first communication device 9100 and a RLM controller 9210 may be included in the second communication device 9200, compared to the RLM controller 11 included in only the memory device 10 illustrated in FIGS. 1 and 12. Each of the RLM controllers 9110 and 9210 may correspond to the RLM controller 11 illustrated in FIGS. 1 and 12. The first communication device 9100 may correspond to the controller 20 and the second communication device 9200 may correspond to the memory device 10 illustrated in FIGS. 1 and 12.

In addition, the transceiver 9120 of the first communication device 9100 and the transceiver 9220 of the second communication device 9200 may control the RLM to the corresponding RLM controllers 9110 and 9210 when transmitting data.

Signaling of low power double data rate (LPDDR) products may use PAM4. When PAM4 is used, gds distortion occurs according to the level of PAM4, since the strength of the driver is found using only the existing NRZ ZQ-calibration and is the strength based on ½*VDD. Therefore, the driver strength varies, and in this case, the gaps between the PAM4 signal levels may not be identical to each other. For example, if the gaps for levels are not identical to each other, the signal sensing margin in RX may be relatively small. Therefore, an additional driver should be used to compensate for the gds distortion at the remaining levels of PAM4 to maintain the gaps to be identical to each other.

The circuit for PAM4 RLM calibration according to example embodiments of the present inventive concept may include a resistance for ZQ-Calibration, an MSB/LSB driver, a comparator, a code generator, a voltage generator for calibration based on the PAM4 level, and an additional driver. In an example embodiment, one comparator may be used for the first part circuit Part1, and a reference voltage may be changed according to a mode, using a multiplexer (MUX).

In example embodiments, the first part circuit Part1 may be implemented by using a plurality of comparators having different reference voltages in parallel.

In the method for PAM4 RLM calibration according to an example embodiment, the mid-level of PAM4 may be adjusted to be a required voltage level through the calibration of an additional code after searching for a PU/PD code by a ZQ-calibration.

As set forth above, in a memory device according to an example embodiment, a signal level calibration thereof, and a memory system thereof, the gaps between signal levels of multilevel signaling to be identical to each other may be maintained using a ZQ calibration and an additional code calibration.

While example embodiments have been illustrated and described above, it will be apparent to those skilled in the art that modifications and variations could be made without departing from the scope of the present inventive concept as defined by the appended claims.

What is claimed is:

1. A memory device comprising:

a transceiver configured to receive or transmit data in a manner selected from a first signaling or a second signaling through a data channel; and a ratio of level separation mismatch (RLM) controller configured to;

maintain at least two gaps between signal levels of the second signaling to be identical to each other when transferring data from the transceiver to an external device, perform pull-up code and pull-down code calibrations using a ZQ calibration for the first signaling, perform an additional most significant bit (MSB) code calibration using an MSB additional driver connected to a first node for the second signaling, and perform an additional least significant bit (LSB) code calibration using an LSB additional driver connected to the first node for the second signaling.

2. The memory device of claim 1, wherein the RLM controller is configured to receive an RLM calibration request from the external device.

3. The memory device of claim 1, wherein the RLM controller is configured to perform RLM calibration using the ZQ calibration and the MSB and LSB additional drivers in response to an RLM calibration request from the external device.

4. The memory device of claim 1, wherein the first signaling is a 2-level signal and the second signaling is at least a 3-level signal.

5. The memory device of claim 1, wherein the RLM controller includes:

a resistor connected between the first node and a ground terminal;

a first comparator configured to output a first comparison voltage by comparing a first adjusted voltage of the first node to a first reference voltage;

a second comparator configured to output a second comparison voltage by comparing a second adjusted voltage of a second node to a second reference voltage;

a first code generator configured to generate a pull-up code, a most significant bit (MSB) additional code, or a least significant bit (LSB) additional code, corresponding to the first comparison voltage;

a second code generator configured to generate a pull-down code corresponding to the second comparison voltage;

a first MSB pull-up driver connected between a power supply terminal and the first node and configured to control driving capability for at least a first higher bit according to the pull-up code;

a first LSB pull-up driver connected between the power supply terminal and the first node and configured to control driving capability for at least a first lower bit according to the pull-up code;

a first MSB pull-down driver connected between the first node and the ground terminal and configured to control driving capability for at least a first higher bit according to the pull-down code;

a first LSB pull-down driver connected between the first node and the ground terminal and configured to control driving capability for at least a first lower bit according to the pull-down code;

a second MSB pull-up driver connected between the power supply terminal and the second node and configured to control driving capability for at least a second higher bit according to the pull-up code;

a second LSB pull-up driver connected between the power supply terminal and the second node and configured to control driving capability for at least a second lower bit according to the pull-up code;

a second MSB pull-down driver connected between the second node and the ground terminal and configured to control driving capability for at least a second higher bit according to the pull-down code;

a second LSB pull-down driver connected between the second node and the ground terminal and configure to control driving capability for at least a second lower bit according to the pull-down code;

the MSB additional driver configured to control driving capability for at least a first higher bit according to the MSB additional code; and the LSB additional driver configured to control driving capability for at least a first lower bit according to the LSB additional code.

6. The memory device of claim 5, further comprising:

a first selector configured to select one of a plurality of signal levels as the first reference voltage.

7. The memory device of claim 5, wherein the second signaling is a multilevel signaling, and wherein the multilevel signaling is a pulse amplitude modulation level-4 (PAM4) signaling.

8. The memory device of claim 7, further comprising:

a first selector configured to select one of a first signal level, a second signal level, and a third signal level as the first reference voltage; and a second selector configured to select the first signal level as the second reference voltage.

9. The memory device of claim 8, wherein the first signal level is higher than the second signal level, wherein the second signal level is higher than the third signal level, wherein the third signal level is higher than a level of the ground terminal, and wherein the level of the ground terminal is a fourth signal level.

10. A memory system comprising:

at least one memory device; and a controller configured to control the at least one memory device, wherein the at least one memory device includes:

a first transceiver configured to receive or transmit data in a manner selected from a first signaling or a second signaling through a data channel; and a first ratio of level separation mismatch (RLM) controller configured to:

maintain at least two gaps between signal levels of the second signaling to be identical to each other when transferring data from the first transceiver to the controller, perform pull-up code and pull-down code calibrations using a ZQ calibration for the first signaling, perform an additional most significant bit (MSB) code calibration using an MSB additional driver connected to a first node for the second signaling, and perform an additional least significant bit (LSB) code calibration using an LSB additional driver connected to the first node for the second signaling.

11. The memory system of claim 10, wherein the controller includes a second RLM controller and a second transceiver configured to transmit or receive the data through the data channel.

12. The memory system of claim 11, wherein the second RLM controller is configured to maintain at least two gaps between signal levels of the second signaling to be identical to each other when transmitting data from the second transceiver to the memory device.

13. The memory system of claim 10, wherein the controller is configured to transmit an RLM calibration request to the memory device in response to a request from a host.

14. An operating method of a memory device, the method comprising:

transmitting data to a controller using one of a first signaling and a second signaling through a data channel;

maintaining at least two gaps between signal levels of the second signaling to be identical to each other during the transmitting data;

performing an additional most significant bit (MSB) code calibration, using an MSB additional driver connected to a first node for the second signaling; and performing an additional least significant bit (LSB) code calibration using an LSB additional driver connected to the first node for the second signaling.

15. The operating method of claim 14, further comprising:

selecting one of the first signaling and the second signaling.

16. The operating method of claim 14, further comprising:

performing pull-up code and pull-down code calibrations, using a ZQ calibration for the first signaling.

17. The operating method of claim 14, wherein the first signaling is a 2-level signal and the second signaling is at least a 3-level signal.

* * * * *